US012640086B2

(12) United States Patent
Wang et al.

(10) Patent No.: US 12,640,086 B2
(45) Date of Patent: May 26, 2026

(54) DISPLAY SUBSTRATE, DRIVING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Mingqiang Wang, Beijing (CN); Zheng Bao, Beijing (CN); Xueying He, Beijing (CN); Zan Luo, Beijing (CN); Hongjin Hu, Beijing (CN); Lian Xiang, Beijing (CN); Jiaxiang Zhang, Beijing (CN); Bin Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/881,411

(22) PCT Filed: Jan. 2, 2024

(86) PCT No.: PCT/CN2024/070026
§ 371 (c)(1),
(2) Date: Jan. 6, 2025

(87) PCT Pub. No.: WO2024/146494
PCT Pub. Date: Jul. 11, 2024

(65) Prior Publication Data
US 2026/0031016 A1 Jan. 29, 2026

(30) Foreign Application Priority Data
Jan. 3, 2023 (CN) .......................... 202310004318.6

(51) Int. Cl.
| | |
|---|---|
| *G09G 3/32* | (2016.01) |
| *H10D 86/40* | (2025.01) |
| *H10D 86/60* | (2025.01) |

(52) U.S. Cl.
CPC ............. *G09G 3/32* (2013.01); *H10D 86/441* (2025.01); *H10D 86/481* (2025.01);
(Continued)

(58) Field of Classification Search
CPC .... H10D 86/481; H10D 86/441; H10D 86/60; G09G 3/32; G09G 2300/0852;
(Continued)

(56) References Cited

U.S. PATENT DOCUMENTS

2009/0135112 A1 5/2009 Uchino et al.
2017/0301702 A1* 10/2017 Kim ..................... H10D 86/471
(Continued)

FOREIGN PATENT DOCUMENTS

BR 112021025146 A2 1/2022
CN 105185307 A 12/2015
(Continued)

OTHER PUBLICATIONS

Office Action dated Jun. 10, 2025, issued in counterpart CN Application No. 202310004318.6, with English translation. (24 pages).

*Primary Examiner* — Xuemei Zheng

(74) *Attorney, Agent, or Firm* — WHDA, LLP

(57) ABSTRACT

The present disclosure provides a display substrate, a driving method thereof and a display device. The display substrate includes n rows of sub-pixels; each sub-pixel in a first row to an i-th row of sub-pixels includes a first sub-pixel driver circuit, each sub-pixel in a (i+1)-th row to an m-th row of sub-pixels includes a second sub-pixel driver circuit, each sub-pixel in a (m+1)-th row to an n-th row of sub-pixels includes a third sub-pixel driver circuit. The first sub-pixel driver circuit includes a first capacitor storage unit, the (Continued)

second sub-pixel driver circuit includes a second capacitor storage unit, and the third sub-pixel driver circuit includes a third capacitor storage unit. A capacitance of the first capacitor storage unit is smaller than a capacitance of the second capacitor storage unit; the capacitance of the second capacitor storage unit is smaller than a capacitance of the third capacitor storage unit.

20 Claims, 18 Drawing Sheets

(52) U.S. Cl.
CPC ..... *H10D 86/60* (2025.01); *G09G 2300/0426* (2013.01); *G09G 2300/0819* (2013.01); *G09G 2300/0842* (2013.01); *G09G 2300/0861* (2013.01); *G09G 2310/0267* (2013.01); *G09G 2310/0286* (2013.01); *G09G 2310/08* (2013.01); *G09G 2320/0233* (2013.01)

(58) Field of Classification Search
CPC ......... G09G 2320/0233; G09G 3/3233; G09G 2310/08; G09G 2300/0842; H10K 59/1216
See application file for complete search history.

(56) References Cited

U.S. PATENT DOCUMENTS

| | | | |
|---|---|---|---|
| 2017/0345367 A1* | 11/2017 | Ka | ..................... H10K 59/1213 |
| 2019/0189072 A1 | 6/2019 | Huang | |
| 2021/0193049 A1 | 6/2021 | Lin et al. | |
| 2022/0139331 A1 | 5/2022 | Jang et al. | |

FOREIGN PATENT DOCUMENTS

| | | | | | |
|---|---|---|---|---|---|
| CN | 108694905 A | | 10/2018 | | |
| CN | 110853576 A | | 2/2020 | | |
| CN | 111883050 A | * | 11/2020 | ........... | G09G 3/3233 |
| CN | 112530369 A | | 3/2021 | | |
| CN | 113299229 A | | 8/2021 | | |
| CN | 113421523 A | | 9/2021 | | |
| CN | 113990242 A | | 1/2022 | | |
| CN | 111383600 B | * | 4/2022 | ........... | G09G 3/3233 |
| CN | 114783380 A | | 7/2022 | | |
| CN | 114822400 A | | 7/2022 | | |
| CN | 116524834 A | | 8/2023 | | |
| KR | 20130066752 A | | 6/2013 | | |
| KR | 20190071159 A | | 6/2019 | | |

* cited by examiner

DISPLAY SUBSTRATE, DRIVING METHOD THEREOF AND DISPLAY DEVICE

CROSS-REFERENCE TO RELATED APPLICATION

The present disclosure is the U.S. national phase of PCT Application PCT/CN2024/070026 filed on Jan. 2, 2024, which claims the priority of Chinese Application No. 202310004318.6, filed on Jan. 3, 2023, the disclosure of which is incorporated in its entirety by reference herein.

TECHNICAL FIELD

The present disclosure relates to the field of display technologies, and in particular to a display substrate and a driving method thereof, and a display device.

BACKGROUND

At present, wearable display products usually adopt 3GSTV timing to improve hysteresis effect of thin film transistors and increase the first frame ratio (abbreviated as FFR). As shown in FIG. 1 and FIG. 2, the 3GSTV timing refers to timing in which a low level width of a frame start signal GSTV of a gate drive circuit includes three low levels of a first clock signal GCK.

However, when the 3GSTV timing is used to drive a display product, a virtual edge phenomenon will be formed at a bottom of a display screen of the display product.

SUMMARY

An object of the present disclosure is to provide a display substrate, a driving method thereof, and a display device.

In order to achieve the above object, the present disclosure provides the following technical solutions.

In a first aspect of the present disclosure, a display substrate is provided and includes: a base substrate and n rows of sub-pixels on the base substrate; wherein each sub-pixel in a first row of sub-pixels to an i-th row of sub-pixels includes a first sub-pixel driver circuit, each sub-pixel in a (i+1)-th row of sub-pixels to an m-th row of sub-pixels includes a second sub-pixel driver circuit, each sub-pixel in a (m+1)-th row of sub-pixels to an n-th row of sub-pixels includes a third sub-pixel driver circuit, $1<i<m$, $m<n$;

wherein the first sub-pixel driver circuit includes a first capacitor storage unit, the second sub-pixel driver circuit includes a second capacitor storage unit, and the third sub-pixel driver circuit includes a third capacitor storage unit;

a capacitance of the first capacitor storage unit is smaller than a capacitance of the second capacitor storage unit; the capacitance of the second capacitor storage unit is smaller than a capacitance of the third capacitor storage unit.

Optionally, $C3=3C1$, $C2=1.5C1$, $C3$ is the capacitance of the third capacitor storage unit, $C2$ is the capacitance of the second capacitor storage unit, and $C1$ is the capacitance of the first capacitor storage unit.

Optionally, the display substrate further includes a plurality of power supply lines; and the first sub-pixel driver circuit further includes a driving transistor;

the first capacitor storage unit includes a first capacitor; a first electrode plate of the first capacitor is coupled to a gate of the driving transistor, and a second electrode plate of the first capacitor is coupled to the corresponding power line.

Optionally, the display substrate further includes a plurality of first control signal lines; the second sub-pixel driver circuit further includes a driving transistor and a first control transistor; the second capacitor storage unit includes a second capacitor and a third capacitor;

a first electrode plate of the second capacitor is coupled to a gate of the driving transistor, and a second electrode plate of the second capacitor is coupled to the corresponding power line; a first electrode plate of the third capacitor is coupled to the gate of the driving transistor, a second electrode plate of the third capacitor is coupled to a first electrode of the first control transistor; a second electrode of the first control transistor is coupled to the corresponding power line, and a gate of the first control transistor is coupled to the corresponding first control signal line.

Optionally, the display substrate further includes at least two second control signal lines; the third sub-pixel driver circuit further includes a driving transistor, a first control transistor and a second control transistor; the third capacitor storage unit includes a fourth capacitor, a fifth capacitor and a sixth capacitor;

a first electrode plate of the fourth capacitor is coupled to a gate of the driving transistor, and a second electrode plate of the fourth capacitor is coupled to the corresponding power line;

a first electrode plate of the fifth capacitor is coupled to the gate of the driving transistor, a second electrode plate of the fifth capacitor is coupled to a first electrode of the first control transistor; a second electrode of the first control transistor is coupled to the corresponding power line; and a gate of the first control transistor is coupled to the corresponding first control signal line;

a first electrode plate of the sixth capacitor is coupled to the gate of the driving transistor, a second electrode plate of the sixth capacitor is coupled to a first electrode of the second control transistor, a second electrode of the second control transistor is coupled to the corresponding power line, and a gate of the second control transistor is coupled to the corresponding second control signal line.

Optionally, a capacitance value of the second capacitor is equal to a capacitance value of the first capacitor, and a capacitance value of the third capacitor is half of the capacitance value of the first capacitor.

Optionally, the first electrode plate of the second capacitor and the first electrode plate of the third capacitor are an integrated structure; the second electrode plate of the second capacitor and the second electrode plate of the third capacitor are in the same layer, and the second electrode plate of the second capacitor and the second electrode plate of the third capacitor are arranged along a first direction.

Optionally, the driving transistor includes a driving active pattern; and an orthographic projection of the second electrode plate of the third capacitor onto the base substrate at least partially overlaps with an orthographic projection of the driving active pattern onto the base substrate.

Optionally, the capacitance value of the fourth capacitor is equal to the capacitance value of the first capacitor, the capacitance value of the fifth capacitor is half of the capacitance value of the first capacitor, and the capacitance value of the sixth capacitor is 1.5 times the capacitance value of the first capacitor.

Optionally, the first electrode plate of the fourth capacitor, the first electrode plate of the fifth capacitor and the first electrode plate of the sixth capacitor are an integrated structure;

the second electrode plate of the fourth capacitor, the second electrode plate of the fifth capacitor and the second electrode plate of the sixth capacitor are in the same layer; the second electrode plate of the fourth capacitor and the second electrode plate of the fifth capacitor are arranged along the first direction; the second electrode plate of the fourth capacitor and the second electrode plate of the sixth capacitor are arranged along the first direction; the second electrode plate of the fifth capacitor and the second electrode plate of the sixth capacitor are arranged along a second direction, and the second direction intersects the first direction.

Optionally, the driving transistor includes a driving active pattern; an orthographic projection of the second electrode plate of the fifth capacitor onto the base substrate at least partially overlaps with an orthographic projection of the driving active pattern onto the base substrate; and/or an orthographic projection of the second electrode plate of the sixth capacitor onto the base substrate at least partially overlaps with the orthographic projection of the driving active pattern onto the base substrate.

Optionally, the second sub-pixel driver circuit and the third sub-pixel driver circuit further include a first conductive connection portion; the first control transistor includes a first control active pattern, the first control active pattern includes a first active portion and a second active portion coupled to each other, the first active portion extends along a first direction, the second active portion extends along a second direction, and the first direction intersects the second direction;

one end of the first active portion away from the second active portion serves as the second electrode of the first control transistor, one end of the second active portion away from the first active portion serves as the first electrode of the first control transistor, and one end of the second active portion away from the first active portion is coupled to the second electrode plate of the third capacitor or the second electrode plate of the fifth capacitor through the first conductive connection portion.

Optionally, the first conductive connection portion includes a first sub-connection portion and a second sub-connection portion coupled to each other, the first sub-connection portion extends along the first direction, and the second sub-connection portion extends along the second direction;

the first sub-connection portion is coupled to the second active portion, and the second sub-connection portion is coupled to the second electrode plate of the third capacitor or the second electrode plate of the fifth capacitor.

Optionally, the display substrate further includes a plurality of light-emitting control signal lines, at least part of the light-emitting control signal lines extending along the first direction;

an orthographic projection of the first sub-connection portion onto the base substrate does not overlap with an orthographic projection of the light-emitting control signal line onto the base substrate, and an orthographic projection of the second sub-connection portion onto the base substrate at least partially overlaps with the orthographic projection of the light-emitting control signal line onto the base substrate.

Optionally, the first control signal line includes at least a portion extending along the first direction;

the orthographic projection of the first sub-connection portion onto the base substrate is located between the orthographic projection of the light-emitting control signal line onto the base substrate and the orthographic projection of the first control signal line onto the base substrate.

Optionally, the sub-pixel in the display substrate further includes a light-emitting element, and the light-emitting element includes an anode pattern; the orthographic projection of the first sub-connection portion onto the base substrate at least partially overlaps with an orthographic projection of the anode pattern in the same sub-pixel onto the base substrate.

Optionally, the third sub-pixel driver circuit further includes a second conductive connection portion; the second control transistor further includes a second control active pattern, the second control active pattern includes at least a portion extending along the first direction, a first end of the second control active pattern serves as the first electrode of the second control transistor, the first end of the second control active pattern is coupled to the second electrode plate of the sixth capacitor through the second conductive connection portion, and a second end of the second control active pattern serves as the second electrode of the second control transistor.

Optionally, the display substrate further includes a plurality of gate lines, the gate line includes at least a portion extending along the first direction;

an orthographic projection of the second conductive connection portion onto the base substrate at least partially overlaps with an orthographic projection of the gate lines onto the base substrate.

Optionally, the second control signal line includes a control main body portion and a control protrusion portion coupled to each other, the control main body portion includes at least a portion extending along the first direction, an orthographic projection of the control protrusion portion onto the base substrate is located between an orthographic projection of the control main body portion onto the base substrate and an orthographic projection of the gate line onto the base substrate, and the control protrusion is coupled to the gate of the second control transistor.

Optionally, a distance between two adjacent first sub-pixel driver circuits in the same row, a distance between two adjacent second sub-pixel driver circuits in the same row, and a distance between two adjacent third sub-pixel driver circuits in the same row are all the same;

on a same side of a center line extending along a second direction of the display substrate, a first boundary of the first sub-pixel driver circuit closest to the center line, a first boundary of the second sub-pixel driver circuit closest to the center line, and a first boundary of the third sub-pixel driver circuit closest to the center line are aligned;

the first boundary is a boundary toward the center line.

Optionally, the sub-pixel further includes a light-emitting element, the light-emitting element includes an anode pattern, the anode pattern includes an anode main body portion and an anode connection portion coupled to each other, and the anode connection portion is coupled to the sub-pixel driver circuit included in the sub-pixel to which the anode connection portion belongs;

the anode main portion of the anode pattern coupled to the first sub-pixel driver circuit, the anode main portion of the anode pattern coupled to the second sub-pixel driver circuit, and the anode main portion of the anode pattern coupled to the third sub-pixel driver circuit are distributed in an array.

Optionally, i=n−4 and m=n−2.

Based on the technical solution of the above display substrate, in a second aspect of the present disclosure, a display device is provided and includes the above display substrate.

Based on the technical solution of the above display substrate, in a third aspect of the present disclosure, a method for driving the above display substrate is provided and includes:

When charging sub-pixels in a (i+1)-th row to an m-th row, controlling, by the first control signal line, the first control transistor to be turned on;

when charging sub-pixels in a (m+1)-th row to an n-th row, controlling, by the first control signal line, the first control transistor to be turned on, and controlling, by the second control signal line, the second control transistor to be turned on.

BRIEF DESCRIPTION OF THE DRAWINGS

The drawings described herein are used to provide a further understanding of the present disclosure and constitute a part of the present disclosure. The illustrative embodiments of the present disclosure and their descriptions are used to explain the present disclosure and do not constitute an improper limitation on the present disclosure. In the drawings.

DETAILED DESCRIPTION

In order to further illustrate the display substrate and its driving method, and the display device according to an embodiment of the present disclosure, a detailed description is given hereinafter in conjunction with the accompanying drawings.

Figure 1:
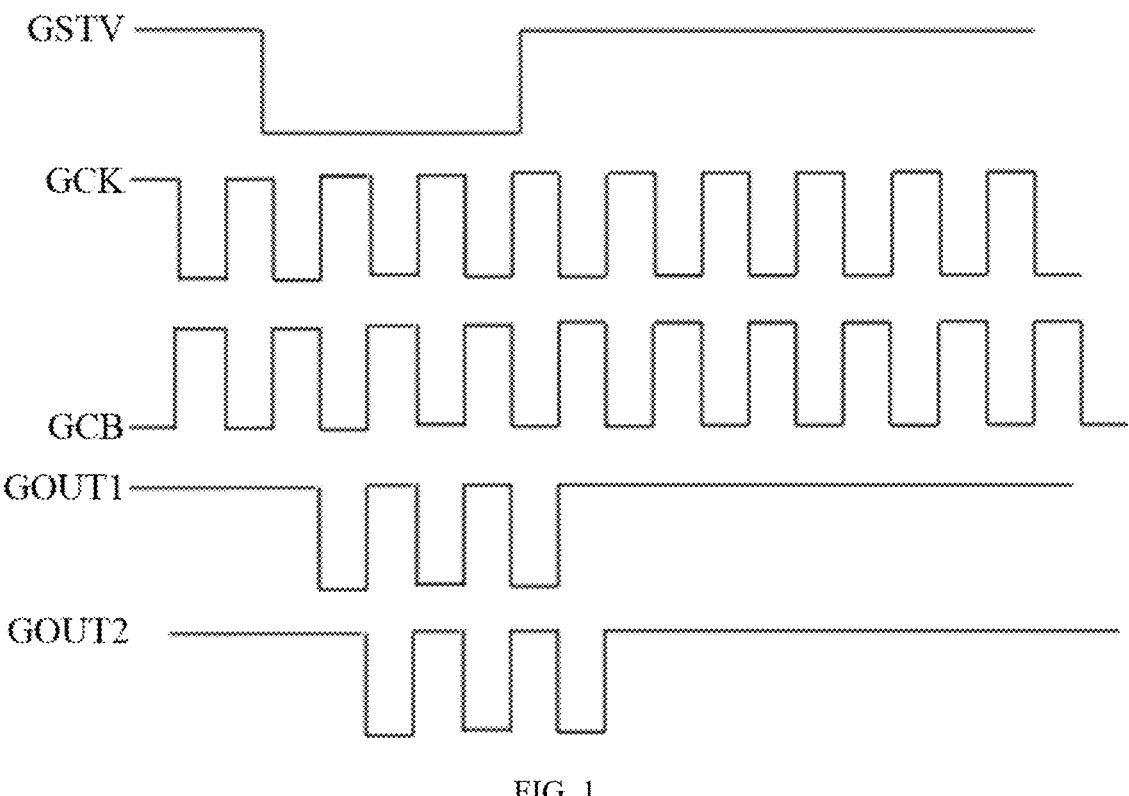
FIG. 1 is a timing diagram of input and output signals of a gate driver circuit according to an embodiment of the present disclosure.

As shown in FIG. 1, FIG. 1 shows timing of a frame start signal GSTV, timing of a first clock signal GCK, timing of a second clock signal GCB, timing of a first gate drive signal GOUT1 output from a first gate drive signal output terminal, and timing of a second gate drive signal GOUT2 output from a second gate drive signal output terminal.

Figure 2:
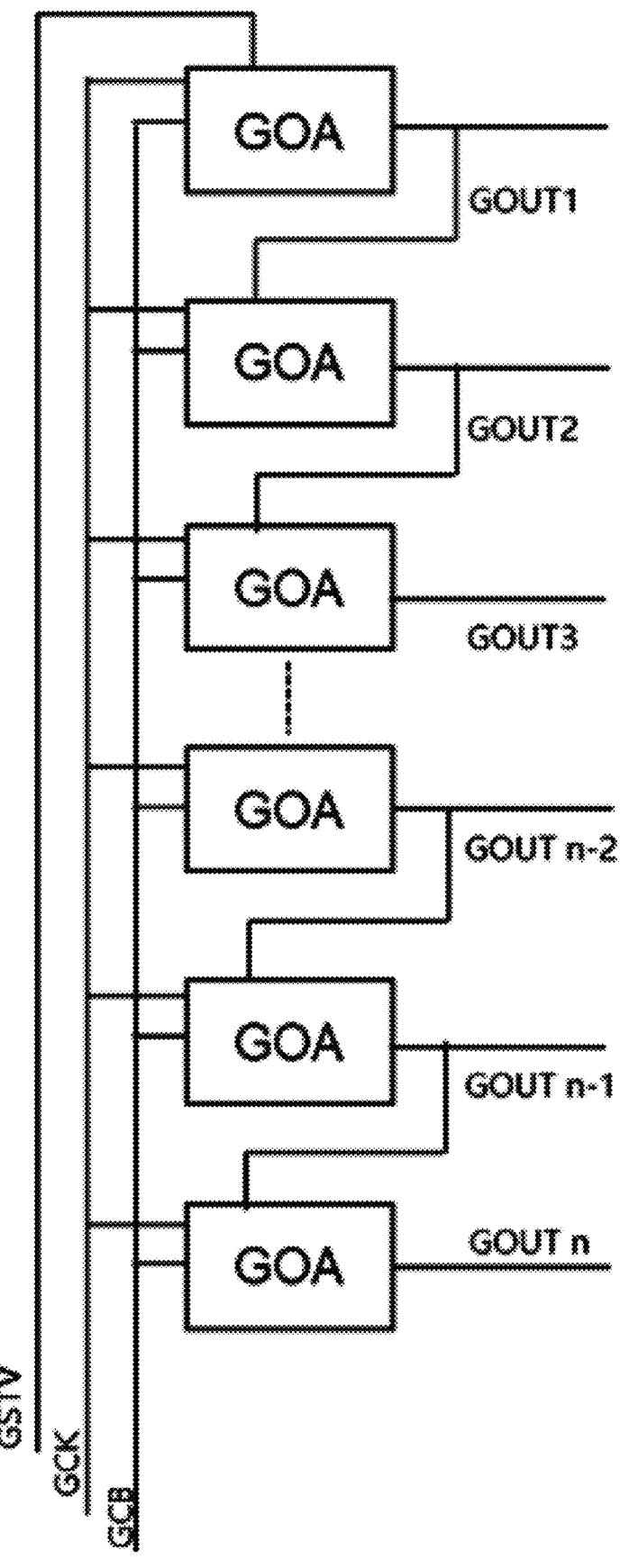
FIG. 2 is a schematic diagram showing connection of multiple shift register units according to an embodiment of the present disclosure.

As shown in FIG. 2, FIG. 2 shows connection relationship of multiple cascaded shift register units GOA. FIG. 2 shows that each shift register unit outputs a corresponding gate drive signal, such as GOUT1-GOUTn.

After research, it was found that when 3GSTV timing is used to drive a display product, the reason why a virtual edge phenomenon will form at a bottom of a display screen of the display product is as follows.

Figure 3:
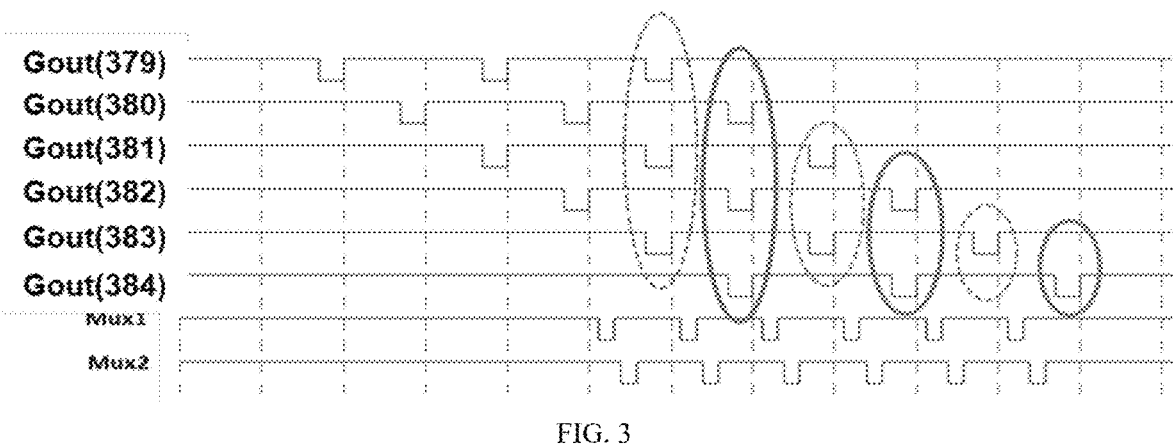
FIG. 3 is a timing diagram of output signals of a gate driver circuit according to an embodiment of the present disclosure.

As shown in FIG. 3, taking a display product with a resolution of 384*384 as an example, a data signal of the 379-th row of sub-pixels is written at the third pulse. At the same time as the data signal is written, gate drive signals Gout(379)/Gout(381)/Gout(383) of the three rows 379/381/383 of sub-pixels are all at an effective level. That is, the three rows of sub-pixels are controlled to start the data signal writing mode, and the data signal charges storage capacitors of the three rows of sub-pixels. After charging, gate voltages of driving transistors included in the sub-pixel driver circuits are: $V(379)=V(380)=Q/(3Cst+Cdata)$, where $V(379)$ is a gate voltage of a driving transistor included in a sub-pixel driver circuit in the 379-th row of sub-pixels; $V(380)$ is a gate voltage of a driving transistor included in a sub-pixel driver circuit in the 380-th row of sub-pixels; and Q is an amount of charge stored between a first electrode plate and a second electrode plate of a capacitor included in the capacitor storage unit; Cst is capacitance of the capacitor storage unit included in the sub-pixel driver circuit; and Cdata is parasitic capacitance on the data line. It is worth noting that FIG. 3 also shows timing of Mux1 signal and Mux2 signal.

When a data signal is written to the sub-pixels in the 381-th row, the gate drive signals Gout(381)/Gout(383) of the sub-pixels in the 381/383 rows are all at an effective level. That is, the two rows of sub-pixels are controlled to start the data signal writing mode, and gate voltages of driving transistors included in the sub-pixel driver circuits are: $V(381)=V(382)=Q/(2Cst+Cdata)$, where $V(381)$ is a gate voltage of a driving transistor included in a sub-pixel driver circuit in the 381-th row of sub-pixels; $V(382)$ is a gate voltage of a driving transistor included in a sub-pixel driver circuit in the 382-th row of sub-pixels.

When a data signal is written to the sub-pixels in the 383-th row, only the gate drive signal Gout(383) of the sub-pixels in the 383-th row is at an effective level. That is, only the 383-th row of sub-pixels is controlled to start the data signal writing mode, and gate voltages of driving transistors included in the sub-pixel driver circuits are: $V(383)=V(384)=Q/(Cst+Cdata)$, where $V(383)$ is a gate voltage of a driving transistor included in a sub-pixel driver circuit in the 383-th row of sub-pixels; $V(384)$ is a gate voltage of a driving transistor included in a sub-pixel driver circuit in the 384-th row of sub-pixels.

Therefore, the gate voltage of the driving transistor included in each sub-pixel driver circuit in the first row to the 380-th row of sub-pixels is different from the gate voltage of the driving transistor included in each sub-pixel driver circuit in the 381-th and 382-th rows of sub-pixels, and is also different from the gate voltage of the driving transistor included in each sub-pixel driver circuit in the 383-th and 384-th rows of sub-pixels, and $V(384/383)>V(382/381)>V(380)$, and thus actual brightness of the sub-pixels in the last few rows is dark, which is called the virtual edge phenomenon.

It is worth noting that the technical solution provided in the present disclosure can solve the virtual edge phenomenon caused by the 3GSTV driving timing, but is not limited to the virtual edge phenomenon caused by the 3GSTV driving timing.

In view of the above problems, the present invention provides the following technical solutions.

Referring to FIG. 4, FIG. 6, FIG. 7 and FIG. 26, one embodiment of the present disclosure provides a display substrate, including: a base substrate and n rows of sub-pixels arranged on the base substrate. Each sub-pixel in the first row of sub-pixels to the i-th row of sub-pixels includes a first sub-pixel driver circuit 11; each sub-pixel in the (i+1)-th row of sub-pixels to the m-th row of sub-pixels includes a second sub-pixel driver circuit 12; each sub-pixel in the (m+1)-th row of sub-pixels to the n-th row of sub-pixels includes a third sub-pixel driver circuit 13; where $1<i<m$, $m<n$, i, m and n are all positive integers. The first sub-pixel driver circuit 11 includes a first capacitor storage unit 110, the second sub-pixel driver circuit 12 includes a second capacitor storage unit 120, and the third sub-pixel driver circuit 13 includes a third capacitor storage unit 130.

The capacitance of the first capacitor storage unit 110 is smaller than the capacitance of the second capacitor storage unit 120. The capacitance of the second capacitor storage unit 120 is smaller than the capacitance of the third capacitor storage unit 130.

Exemplarily, $i=n-4$, $m=n-2$.

Exemplarily, the display substrate includes multiple sub-pixels on the base substrate, and the multiple sub-pixels can be divided into n rows×j columns of sub-pixels. A display area of the display substrate is divided into three areas, the first row of sub-pixels to the i-th row of sub-pixels are located in a first area, the (i+1)-th row of sub-pixels to the m-th row of sub-pixels are located in a second area, and the (m+1)-th row of sub-pixels to the n-th row of sub-pixels are located in a third area.

Exemplarily, all the first sub-pixel driver circuits 11, all the second sub-pixel driver circuits 12 and all the third sub-pixel driver circuits 13 included in the display substrate are distributed in an array.

Exemplarily, each of the first sub-pixel driver circuit 11, the second sub-pixel driver circuit 12 and the third sub-pixel driver circuit 13 includes a driving transistor T3. The first capacitor storage unit 110, the second capacitor storage unit 120 and the third capacitor storage unit 130 are all connected between a gate T3-g of the driving transistor T3 included in the sub-pixel driver circuit to which they belong and a power line VDD.

Exemplarily, the number of sub-pixels included in each row of sub-pixels from the first row of sub-pixels to the i-th row of sub-pixels, is greater than the number of sub-pixels included in each row of sub-pixels from the (i+1)-th row of sub-pixels to the m-th row of sub-pixels; the number of sub-pixels included in each row of sub-pixels from the (i+1)-th row of sub-pixels to the m-th row of sub-pixels is greater than the number of sub-pixels included in each row of sub-pixels from the (m+1)-th row of sub-pixels to the n-th row of sub-pixels.

According to the specific structure of the above display substrate, in the display substrate provided in the embodiment of the present disclosure, the first sub-pixel driver circuit 11 includes the first capacitor storage unit 110, the second sub-pixel driver circuit 12 includes the second capacitor storage unit 120, and the third sub-pixel driver circuit 13 includes the third capacitor storage unit 130; and the capacitance of the first capacitor storage unit 110 is smaller than the capacitance of the second capacitor storage unit 120, and the capacitance of the second capacitor storage unit 120 is smaller than the capacitance of the third capacitor storage unit 130; the difference between $V(1\sim i)$, $V(i+1/m)$ and $V(m+1/n)$ caused by the capacitor storage unit can be reduced, thereby effectively improving the phenomenon that the actual brightness of the sub-pixels in the last few rows of the display substrate is dark, and improving the virtual edge phenomenon of the display substrate.

It is to be noted that $V(1\sim i)$ refers to the gate voltage of the driving transistor T3 included in each sub-pixel driver circuit in the first to i-th rows of sub-pixels. $V(i+1/m)$ refers to the gate voltage of the driving transistor T3 included in each sub-pixel driver circuit in the (i+1)-th and m-th rows of sub-pixels. $V(m+1/n)$ refers to the gate voltage of the driving transistor T3 included in each sub-pixel driver circuit in the (m+1)-th and n-th rows of sub-pixels.

In some embodiments, $C3=3C1$, $C2=1.5C1$ is set; where C3 is the capacitance of the third capacitor storage unit 130, C2 is the capacitance of the second capacitor storage unit 120, and C1 is the capacitance of the first capacitor storage unit 110.

The above setting mode makes V(1~i)=Q/(3C1+Cdata), V(i+1/m)=Q/(2*1.5C1+Cdata), V(m+1/n)=Q/(3C1+Cdata), thereby minimizing the difference caused by the capacitor storage unit in V(1~i), V(i+1/m) and V(m+1/n), which enables each row of sub-pixels in the full screen of the display substrate to have consistent loading at the charging time, thereby effectively improving the phenomenon that the actual brightness of the sub-pixels in the last few rows of the display substrate is dark, and improving the virtual edge phenomenon of the display substrate.

As shown in FIG. 4 and FIG. 9 to FIG. 13, in some embodiments, the display substrate further includes multiple power lines VDD. The first sub-pixel driver circuit 11 further includes a driving transistor T3.

The first capacitor storage unit 110 includes a first capacitor Cst1. A first electrode plate Cst11 of the first capacitor Cst1 is coupled to a gate T3-g of the driving transistor T3, and a second electrode plate Cst12 of the first capacitor Cst1 is coupled to the corresponding power line VDD.

Figure 4:
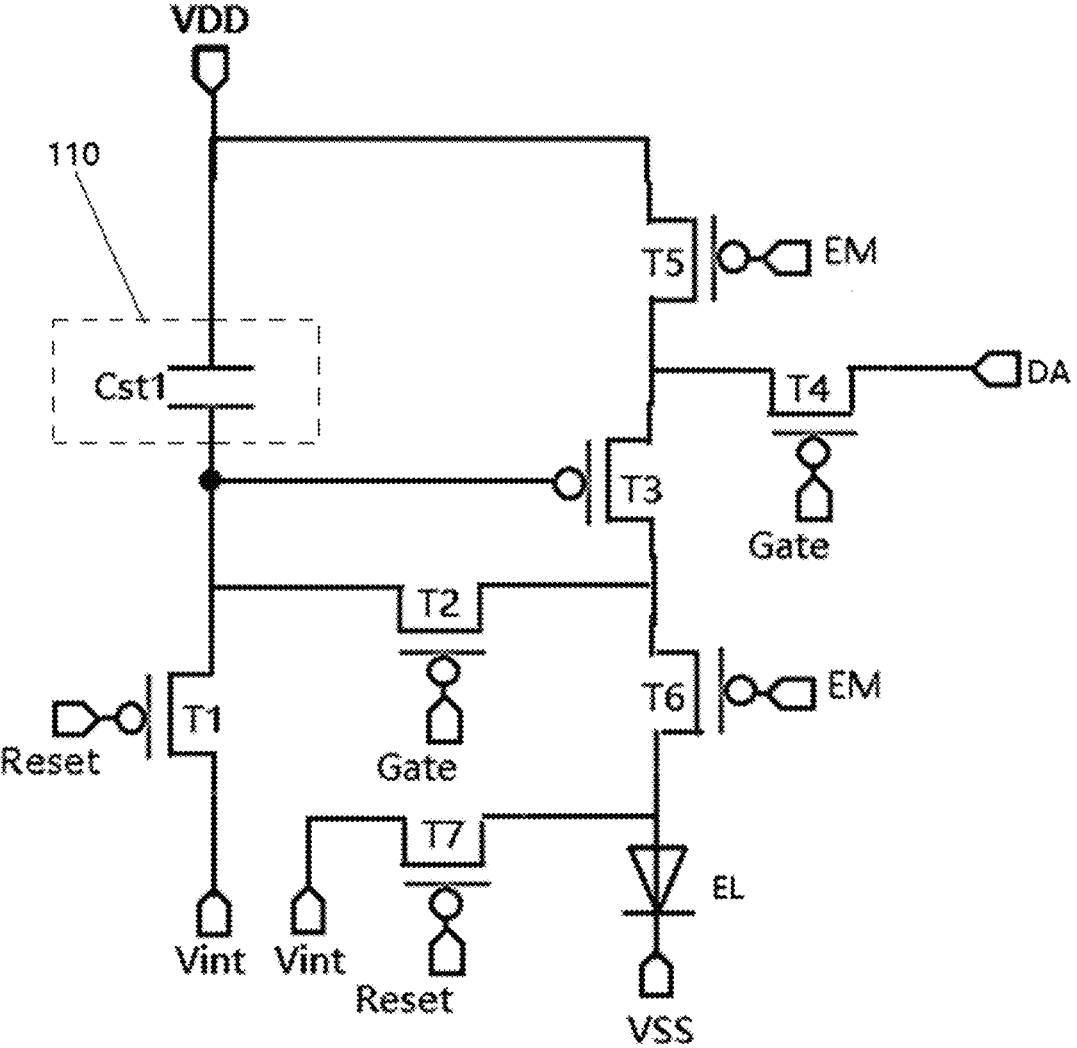
FIG. 4 is a schematic diagram of a circuit structure of a first sub-pixel driver circuit according to an embodiment of the present disclosure.
Figures 5, 6:
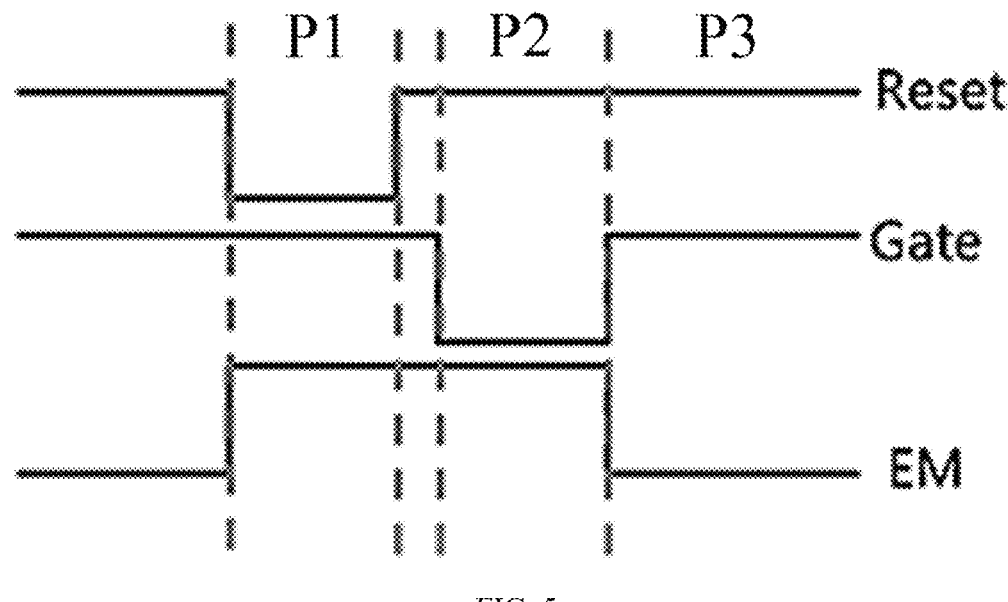
FIG. 5 is an operation timing diagram of the first sub-pixel driver circuit according to an embodiment of the present disclosure.
FIG. 6 is a schematic diagram of a circuit structure of a second sub-pixel driver circuit according to an embodiment of the present disclosure.
Figures 7, 8:
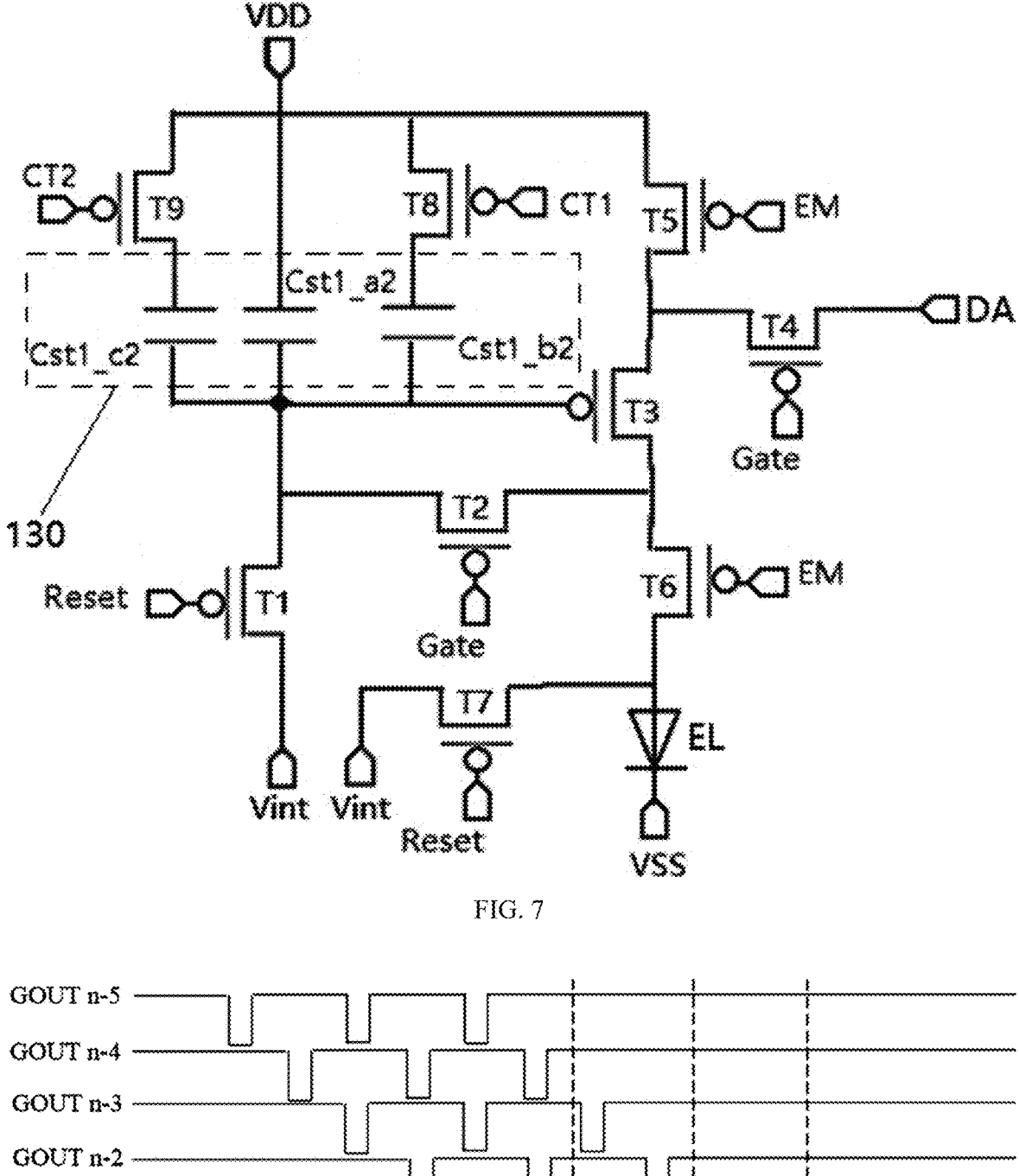
FIG. 7 is a schematic diagram of a circuit structure of a third sub-pixel driver circuit according to an embodiment of the present disclosure.
FIG. 8 is a timing diagram of output signals and control signals of a gate driver circuit according to an embodiment of the present disclosure.
Figure 9:
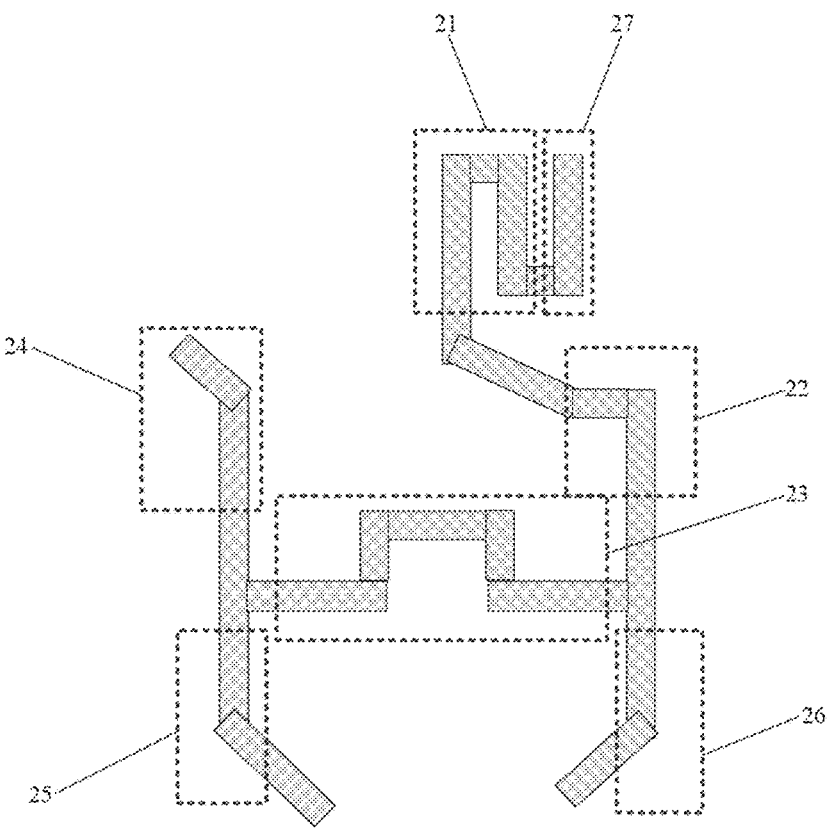
FIG. 9 is a layout diagram of an active layer of a first sub-pixel driver circuit according to an embodiment of the present disclosure.
Figure 10:
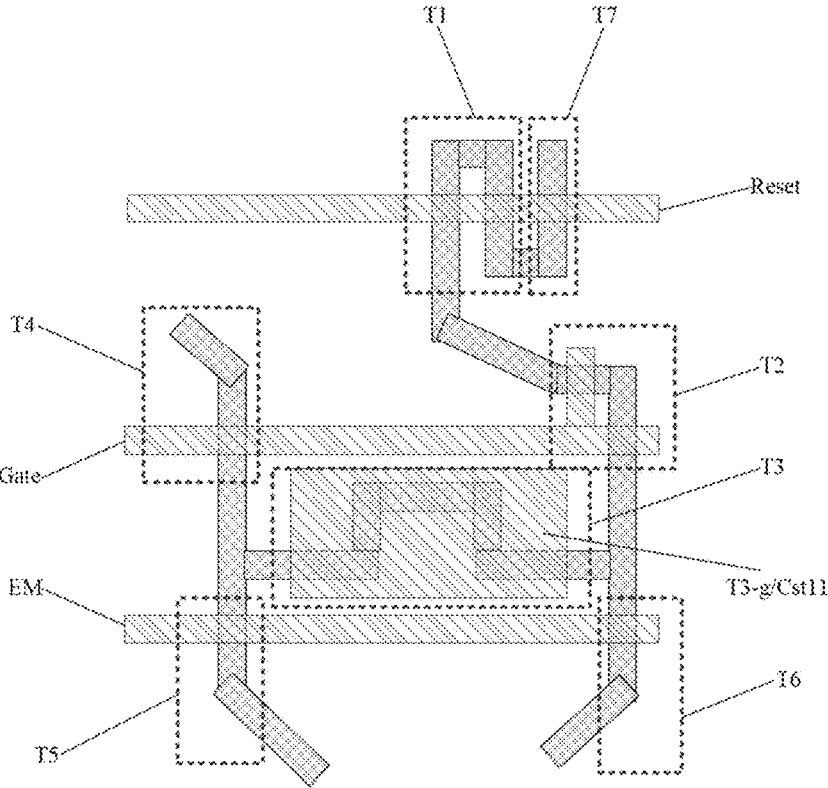
FIG. 10 is a layout diagram of an active layer and a first gate metal layer of a first sub-pixel driver circuit according to an embodiment of the present disclosure.
Figure 11:
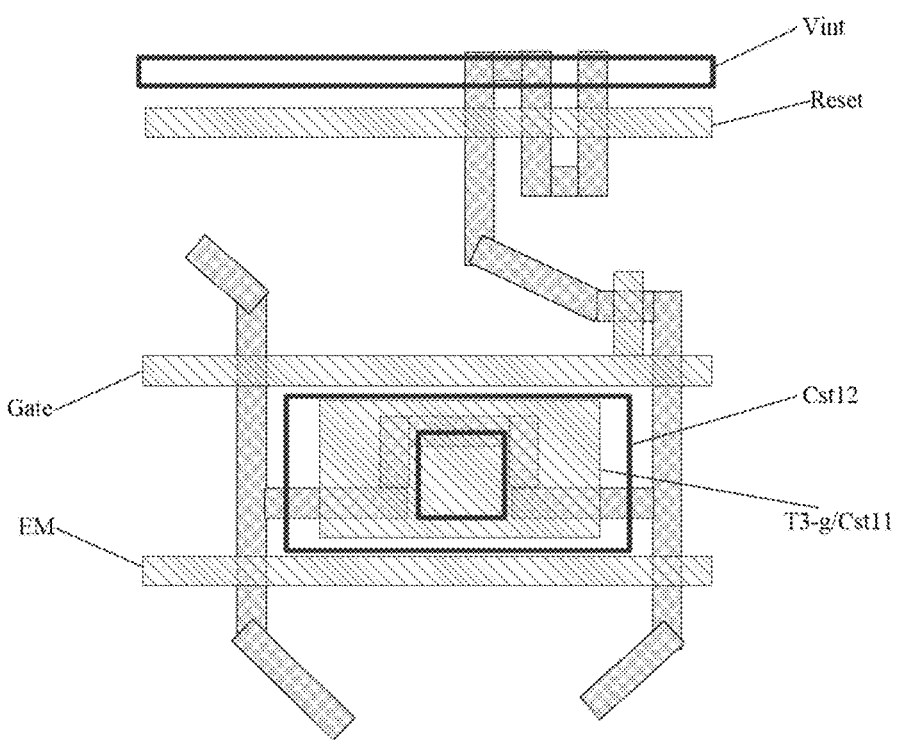
FIG. 11 is a layout diagram showing a second gate metal layer added on the basis of FIG. 10.
Figure 12:
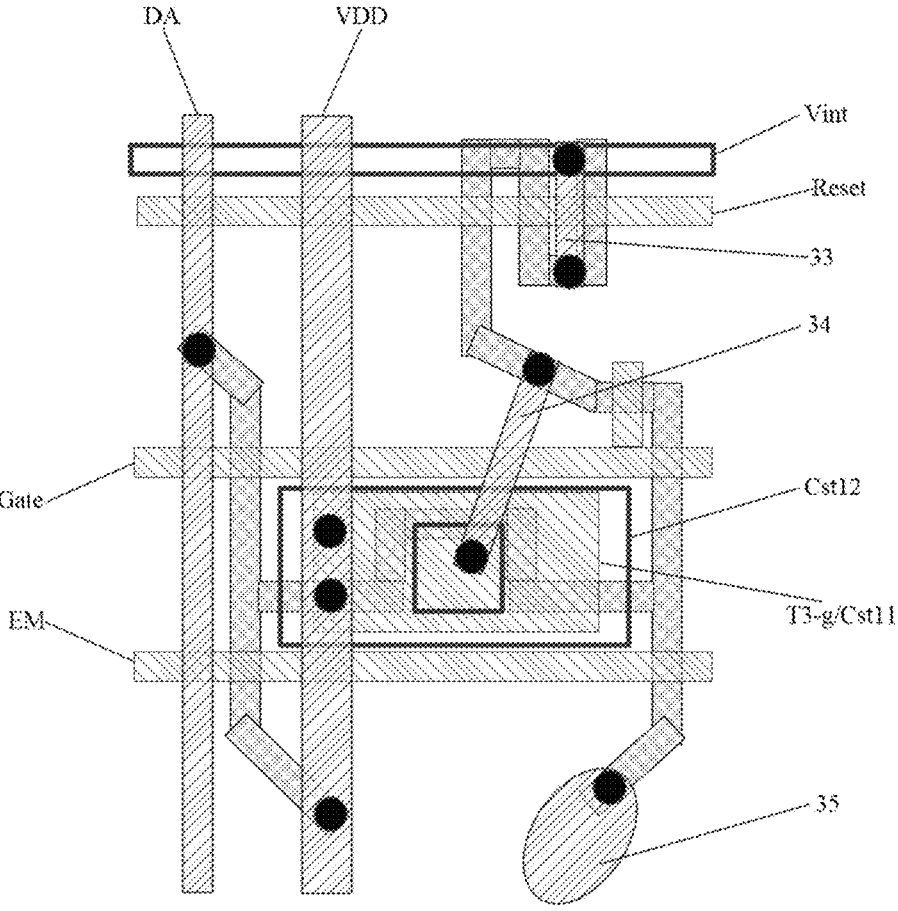
FIG. 12 is a layout diagram showing a first source-drain metal layer added on the basis of FIG. 11.
Figure 13:
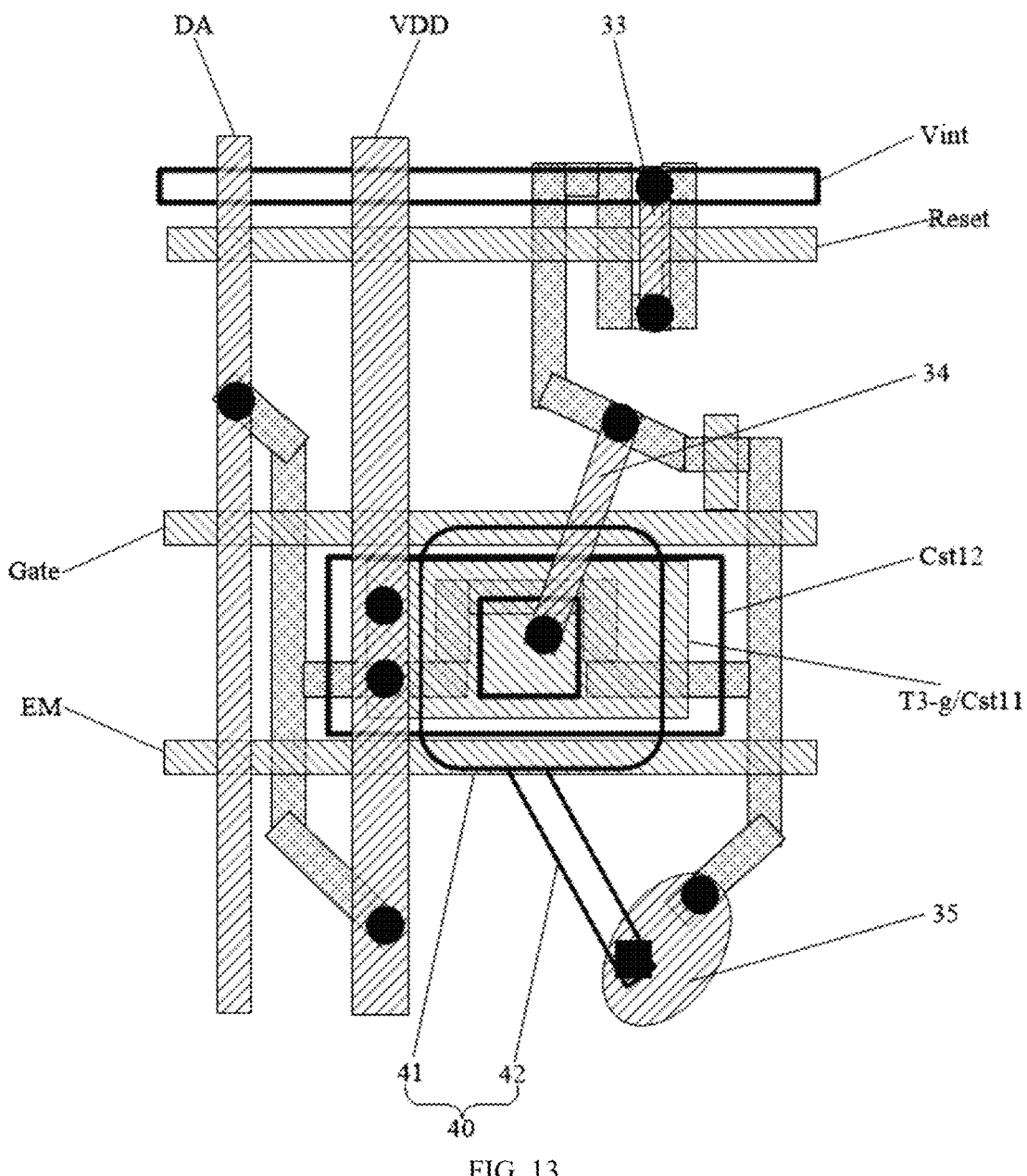
FIG. 13 is a layout diagram showing an anode layer added on the basis of FIG. 12.
Figure 14:
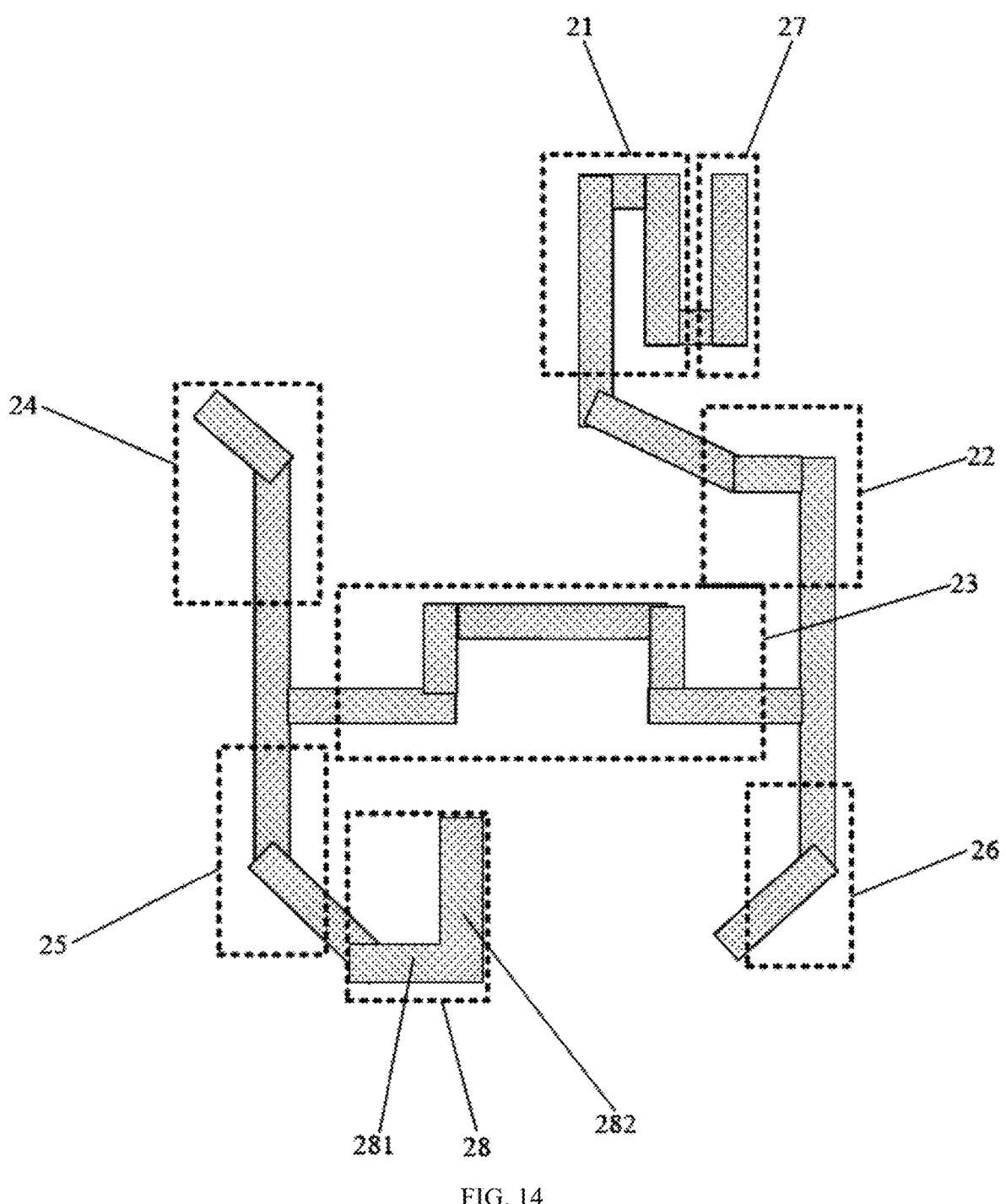
FIG. 14 is a layout diagram of an active layer of a second sub-pixel driver circuit according to an embodiment of the present disclosure.
Figure 15:
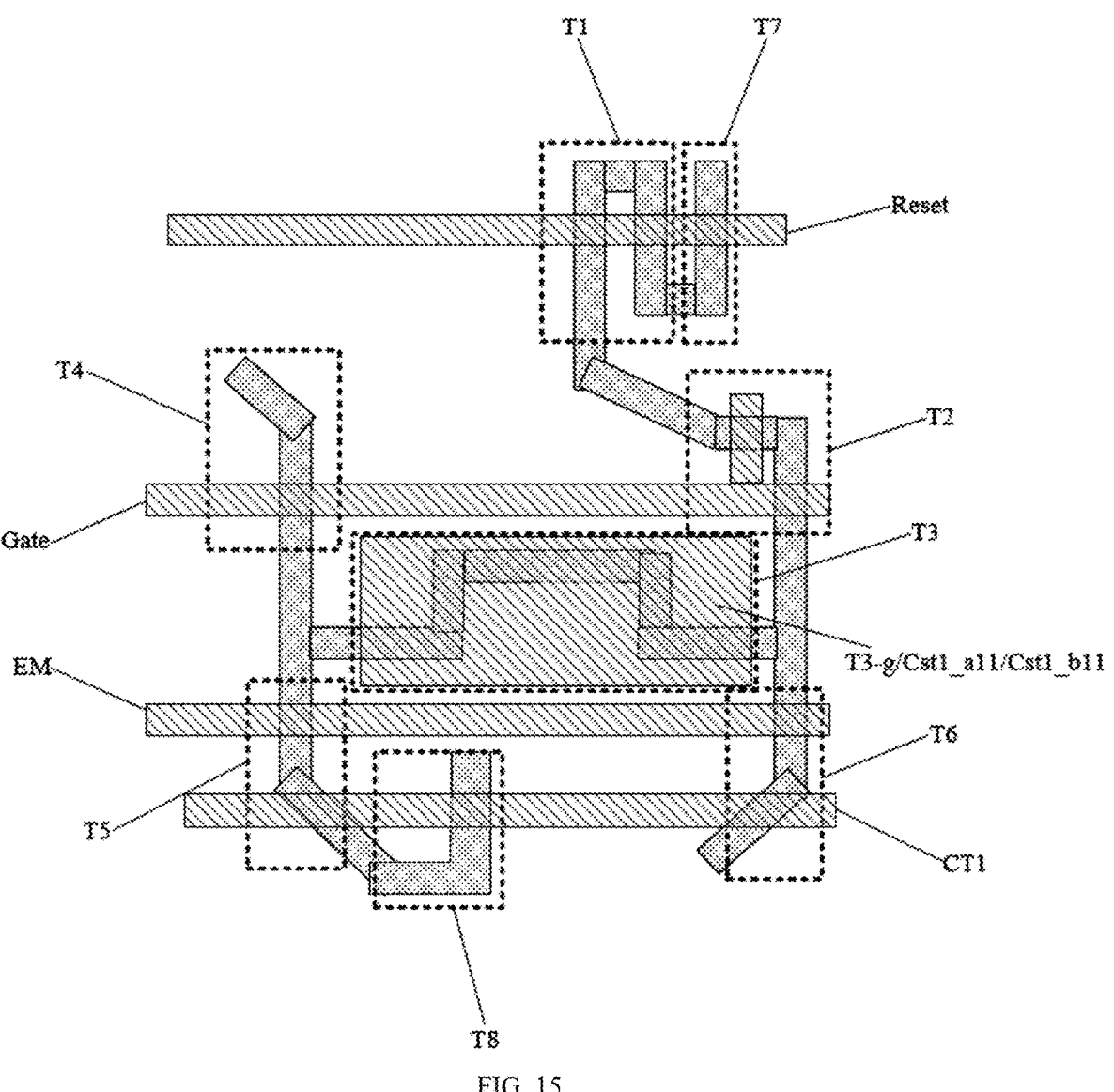
FIG. 15 is a layout diagram of an active layer and a first gate metal layer of a second sub-pixel driver circuit according to an embodiment of the present disclosure.

As shown in FIG. 4 and FIG. 5, exemplarily, the display substrate further includes: multiple reset signal lines Reset, multiple initialization signal lines Vint, multiple gate lines Gate, multiple data lines DA, multiple light-emitting control signal lines EM, and multiple power lines VDD.

Exemplarily, the first sub-pixel driver circuit 11 includes a 7T1C circuit structure (i.e., 7 transistors and 1 capacitor), but is not limited thereto.

Exemplarily, the sub-pixel driver circuit includes: a driving transistor T3, a first reset transistor T1, a compensation transistor T2, a data writing transistor T4, a power control transistor T5, a light emission control transistor T6, a second reset transistor T7 and a first capacitor Cst1.

A gate of the first reset transistor T1 is coupled to a corresponding reset signal line Reset, a first electrode of the first reset transistor T1 is coupled to a corresponding initialization signal line Vint, and a second electrode of the first reset transistor T1 is coupled to a gate of the driving transistor T3.

A gate of the compensation transistor T2 is coupled to the corresponding gate line Gate, a first electrode of the compensation transistor T2 is coupled to a second electrode of the driving transistor T3, and a second electrode of the compensation transistor T2 is coupled to the gate of the driving transistor T3.

A gate of the data writing transistor T4 is coupled to the corresponding gate line Gate, a first electrode of the data writing transistor T4 is coupled to the corresponding data line DA, and a second electrode of the data writing transistor T4 is coupled to a first electrode of the driving transistor T3.

A gate of the power control transistor T5 is coupled to the corresponding light-emitting control signal line EM, a first electrode of the power control transistor T5 is coupled to a corresponding positive power line VDD, and a second electrode of the power control transistor T5 is coupled to the first electrode of the driving transistor T3.

A gate of the light-emitting control transistor T6 is coupled to a corresponding light-emitting control signal line EM, a first electrode of the light-emitting control transistor T6 is coupled to a second electrode of the driving transistor T3, and a second electrode of the light-emitting control transistor T6 is coupled to an anode of a corresponding light-emitting element.

A gate of the second reset transistor T7 is coupled to a corresponding reset signal line Reset, a first electrode of the second reset transistor T7 is coupled to the corresponding initialization signal line Vint, and a second electrode of the second reset transistor T7 is coupled to a corresponding anode of the light-emitting element EL. A cathode of the light-emitting element EL receives the power signal VSS.

A first electrode plate of the first capacitor Cst1 is coupled to the gate of the driving transistor T3, and a second electrode plate of the storage capacitor Cst is coupled to a power line VDD.

The operation process of the first pixel driver circuit is as follows.

During a reset period P1, the first reset transistor T1 is turned on, and an initialization signal transmitted by the initialization signal line Vint is written into the first electrode plate of the first capacitor Cst1 to charge the first capacitor Cst1; the driving transistor T3 is turned on, and a gate voltage of the driving transistor T3 is a voltage of the initialization signal; the second reset transistor T7 is turned on, and the initialization signal is written into an anode pattern 40 of a light-emitting element to release residual charges; the compensation transistor T2, the data writing transistor T4, the power control transistor T5 and the light-emitting control transistor T6 are all turned off.

During a pixel charging period P2, the first reset transistor T1 and the second reset transistor T7 are turned off, the power control transistor T5 and the light-emitting control transistor T6 are turned off, the compensation transistor T2 and the data writing transistor T4 are turned on; a data signal transmitted by the data line DA is written into the circuit and is transmitted in a path of the data writing transistor T4, the driving transistor T3 and the compensation transistor T2, and charges the first capacitor Cst1. The driving transistor T3 is gradually turned off, and when Vgs=Vg−Vs=Vg−Vdata≥Vth, the driving transistor T3 is turned off, the first capacitor Cst1 is fully charged, and the gate voltage Vg of the driving transistor T3 is Vg=Vth+Vdata. It is to be noted that Vgs is a gate-source voltage difference of the driving transistor T3, Vg is a gate voltage value of the driving transistor T3, Vs is a source voltage value of the driving transistor T3, Vdata is a voltage value of the data signal, and Vth is a threshold voltage of the driving transistor T3.

During the light-emitting period P3, the first reset transistor T1 and the second reset transistor T7 are turned off, the compensation transistor T2 and the data writing transistor T4 are turned off, the power control transistor T5 and the light-emitting control transistor T6 are turned on, and the power signal transmitted by the power line VDD is written into the circuit. At this point, the source voltage Vs of the driving transistor T3 is Vs=Vdd, where Vdd is a voltage value of the power signal; the gate voltage value of the driving transistor T3 is Vg=Vth+Vdata, Vgs=Vth+Vdata−Vdd<Vth, the driving transistor T3 is turned on, the screen is lit, the 7T1C circuit eliminates the Vth difference, and brightness uniformity is better.

$$Id = \frac{W}{2L}\mu Cox(Vgs - Vth)^2 = \frac{W}{2L}\mu Cox(Vth + Vdata - Vdd - Vth)^2$$

$$Id = \frac{W}{2L}\mu Cox(Vdata - Vdd)^2$$

Where W/L is a width-to-length ratio of the driving transistor T3, Cox is a dielectric constant of a gate oxide layer; and p is the electron mobility.

As shown in FIG. 6, FIG. 8, FIG. 14 to FIG. 19, and FIG. 26, in some embodiments, the display substrate further includes multiple first control signal lines CT1; the second sub-pixel driver circuit 12 further includes a driving transistor T3 and a first control transistor T8; the second capacitor storage unit 120 includes a second capacitor Cst1_*a*1 and a third capacitor Cst1_*b*1.

A first electrode plate Cst1_*a*11 of the second capacitor Cst1_*a*1 is coupled to a gate T3-*g* of the driving transistor T3, and a second electrode plate Cst1_*a*12 of the second capacitor Cst1_*a*1 is coupled to a corresponding power line VDD. A first electrode plate Cst1_*b*11 of the third capacitor Cst1_*b*1 is coupled to the gate T3-*g* of the driving transistor T3, and a second electrode plate Cst1_*b*12 of the third capacitor Cst1_*b*1 is coupled to a first electrode of the first control transistor T8. A second electrode of the first control transistor T8 is coupled to the corresponding power line VDD, and a gate of the first control transistor T8 is coupled to the corresponding first control signal line CT1.

Exemplarily, a capacitance value of the second capacitor is equal to the capacitance value of the first capacitor, and a capacitance value of the third capacitor is half of the capacitance value of the first capacitor. The first control transistor T8 is used to control whether the third capacitor is connected to the circuit.

Exemplarily, the second sub-pixel driver circuit 12 adopts an 8T2C circuit structure. Compared with the first sub-pixel driver circuit 11, the second sub-pixel driver circuit 12 has an additional capacitor and a first control transistor.

Exemplarily, when the first control signal transmitted by the first control signal line CT1 is at a low level, the first control transistor T8 is turned on, the second electrode plate Cst1_*b*12 of the third capacitor Cst1_*b*1 is electrically connected to the power line VDD, the second capacitor and the third capacitor are connected in parallel. At this point, the storage capacitor size of the second sub-pixel driver circuit 12 is 1.5*C1. When the first control signal transmitted by the first control signal line CT1 is at a high level, the first control transistor T8 is turned off, the second electrode plate Cst1_*b*12 of the third capacitor Cst1_*b*1 is not electrically connected to the power line VDD, the third capacitor is invalid. At this point, the storage capacitor size of the second sub-pixel driver circuit 12 is C1.

In the display substrate provided in the above embodiment, the first control transistor T8 is used to control whether the third capacitor is connected to the circuit, so that in the pixel charging period of the (i+1)-th row of sub-pixels to the m-th row of sub-pixels, the second capacitor and the third capacitor are connected in parallel, which enables the storage capacitor size of the second sub-pixel driver circuit 12 at this time to be 1.5*C1, thereby minimizing the difference caused by the capacitor storage unit, effectively improving the phenomenon that the actual brightness of the sub-pixels in the (i+1)-th row to the m-th row of the display substrate is dark, and improving the virtual edge phenomenon of the display substrate.

As shown in FIG. 7, FIG. 8, and FIG. 20 to FIG. 26, in some embodiments, the display substrate further includes at least two second control signal lines CT2; the third sub-pixel driver circuit 13 further includes a driving transistor T3, a first control transistor T8 and a second control transistor T9; the third capacitor storage unit 130 includes a fourth capacitor Cst1_*a*2, a fifth capacitor Cst1_*b*2 and a sixth capacitor Cst1_*c*2.

A first electrode plate Cst1_*a*21 of the fourth capacitor Cst1_*a*2 is coupled to the gate T3-*g* of the driving transistor T3, and a second electrode plate Cst1_*a*22 of the fourth capacitor Cst1_*a*2 is coupled to the corresponding power line VDD.

A first electrode Cst1_*b*21 of the fifth capacitor Cst1_*b*2 is coupled to the gate T3-*g* of the driving transistor T3, and a second electrode Cst1_*b*22 of the fifth capacitor Cst1_*b*2 is coupled to a first electrode of the first control transistor T8. A second electrode of the first control transistor T8 is coupled to the corresponding power line VDD, and a gate of the first control transistor T8 is coupled to the corresponding first control signal line CT1.

A first electrode Cst1_*c*21 of the sixth capacitor Cst1_*c*2 is coupled to the gate T3-*g* of the driving transistor T3, and a second electrode Cst1_*c*22 of the sixth capacitor Cst1_*c*2 is coupled to a first electrode of the second control transistor T9. A second electrode of the second control transistor T9 is coupled to the corresponding power line VDD, and a gate of the second control transistor T9 is coupled to the corresponding second control signal line CT2.

Exemplarily, a capacitance value of the fourth capacitor is equal to the capacitance value of the first capacitor, a capacitance value of the fifth capacitor is half of the capacitance value of the first capacitor, and a capacitance value of the sixth capacitor is 1.5 times the capacitance value of the first capacitor. The first control transistor T8 is used to control whether the fifth capacitor is connected to the circuit. The second control transistor T9 is used to control whether the sixth capacitor is connected to the circuit.

Exemplarily, the second sub-pixel driver circuit 12 adopts a 9T3C circuit structure. Compared with the first sub-pixel driver circuit 11, the third sub-pixel driver circuit 13 has two more capacitors, a first control transistor T8 and a second control transistor T9.

Exemplarily, when the first control signal transmitted by the first control signal line CT1 is at a low level, the first control transistor T8 is turned on, and the second electrode plate Cst1_*b*22 of the fifth capacitor Cst1_*b*2 is electrically connected to the power line VDD. When the second control signal transmitted by the second control signal line CT2 is at a low level, the second control transistor T9 is turned on, and the second electrode plate Cst1_*c*22 of the sixth capacitor Cst1_*c*2 is electrically connected to the power line VDD; the fourth capacitor, the fifth capacitor and the sixth capacitor are connected in parallel; at this time, the storage capacitor size of the third sub-pixel driver circuit 13 is (1+1.5+0.5)*C1. When the first control signal transmitted by the first control signal line CT1 is at a high level, the first control transistor T8 is turned off, the second electrode plate Cst1_*b*22 of the fifth capacitor Cst1_*b*2 is not electrically connected to the power line VDD, and the fifth capacitor is invalid. When the second control signal transmitted by the second control signal line CT2 is at a high level, the second control transistor T9 is turned off, the second electrode plate Cst1_*c*22 of the sixth capacitor Cst1_*c*2 is not electrically connected to the power line VDD, and the sixth capacitor is invalid. At this time, the storage capacitor size of the third sub-pixel driver circuit 13 is C1.

Exemplarily, the first control signal line CT1 and the second control signal line CT2 are connected to the GPIO port of the DDIC to receive the corresponding first control signal and the second control signal.

The above setting mode enables V(1~i)=Q/(3C1+Cdata), V(i+1/m)=Q/(2*1.5C1+Cdata), V(m+1/n)=Q/(3C1+Cdata), thereby minimizing the difference between V(1~i), V(i+1/m) and V(m+1/n) caused by the capacitor storage unit, enabling each row of sub-pixels in the full screen of the display substrate to have consistent loading at the charging time, which effectively improves the phenomenon that the actual brightness of the sub-pixels in the last few rows of the display substrate is dark, and improves the virtual edge phenomenon of the display substrate.

Figure 16:
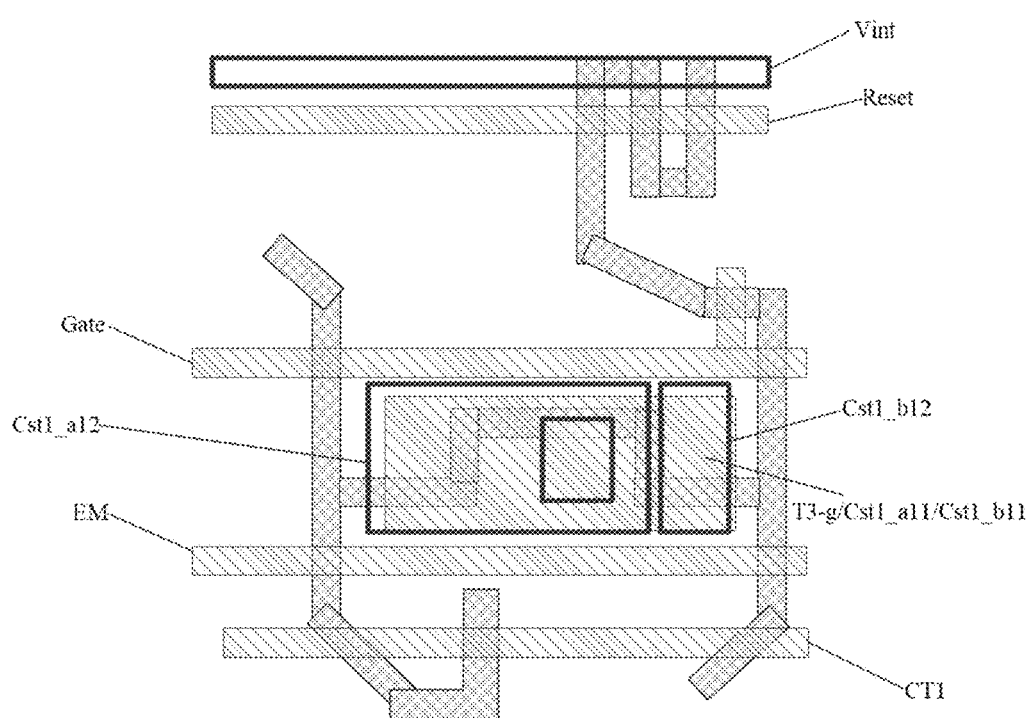
FIG. 16 is a layout diagram showing a second gate metal layer added on the basis of FIG. 15.
Figure 17:
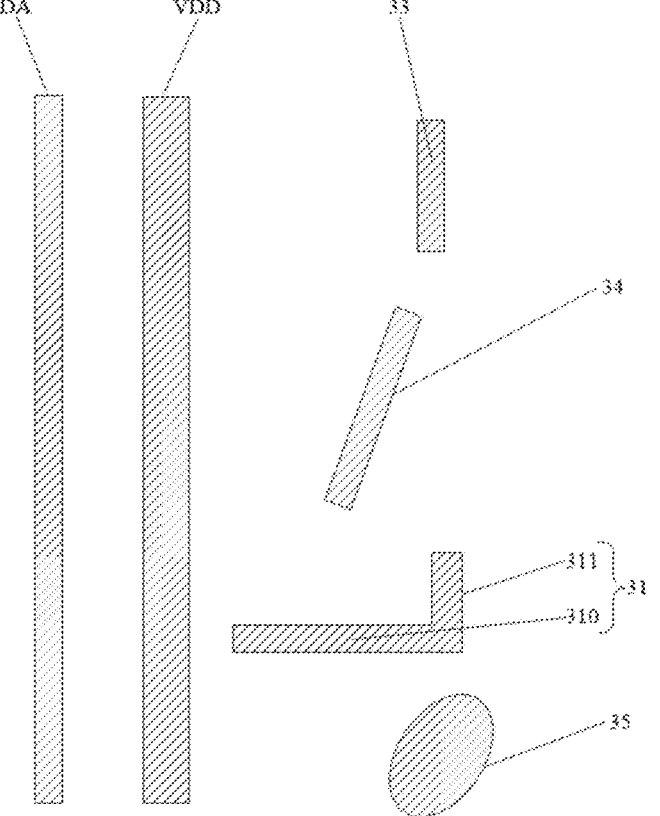
FIG. 17 is a layout diagram of a first source-drain metal layer of a second sub-pixel driver circuit according to an embodiment of the present disclosure.
Figure 18:
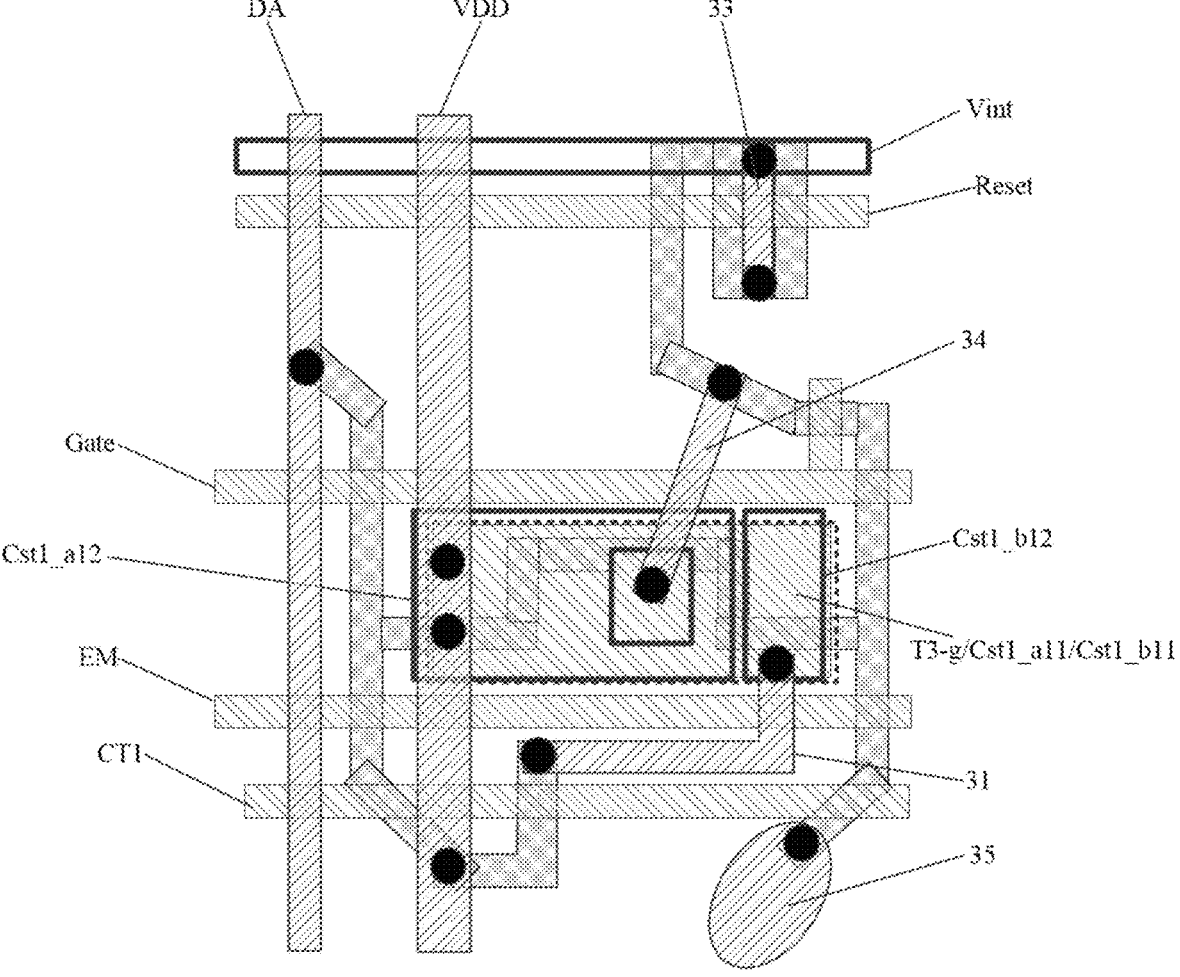
FIG. 18 is a layout diagram showing a first source-drain metal layer added on the basis of FIG. 16.
Figure 19:
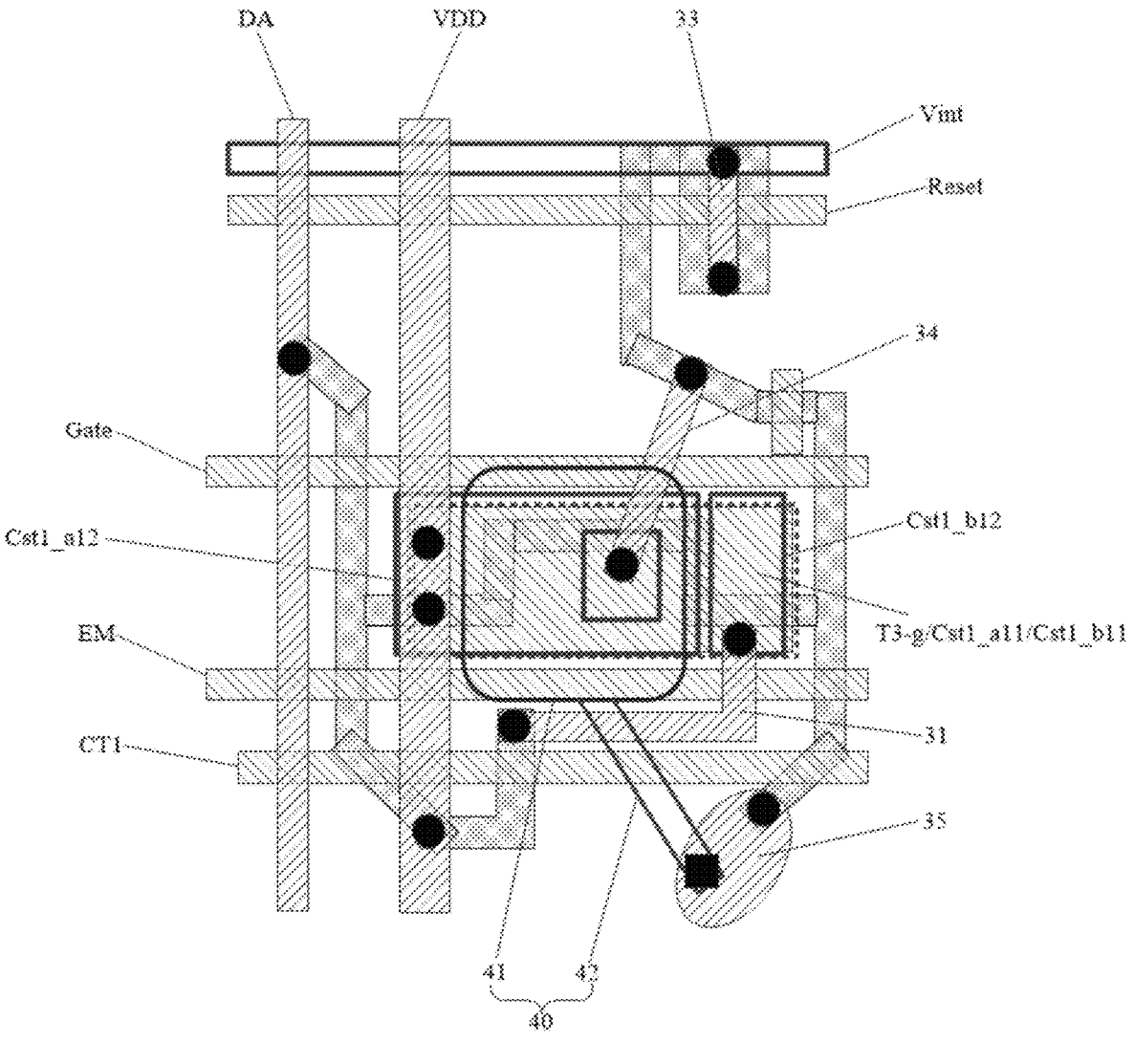
FIG. 19 is a layout diagram showing an anode layer added on the basis of FIG. 18.

As shown in FIG. 16, in some embodiments, the first electrode plate Cst1_*a*11 of the second capacitor Cst1_*a*1 and the first electrode plate Cst1_*b*11 of the third capacitor Cst1_*b*1 are arranged to form an integrated structure; the second electrode plate Cst1_*a*12 of the second capacitor Cst1_*a*1 and the second electrode plate Cst1_*b*12 of the third capacitor Cst1_*b*1 are arranged in the same layer; and the second electrode plate Cst1_*a*12 of the second capacitor Cst1_*a*1 and the second electrode plate Cst1_*b*12 of the third capacitor Cst1_*b*1 are arranged along a first direction.

Exemplarily, the gate T3-*g* of the driving transistor T3 is reused as the first electrode plate Cst1_*a*11 of the second capacitor Cst1_*a*1 and the first electrode plate Cst1_*b*11 of the third capacitor Cst1_*b*1.

Exemplarily, the display substrate includes an active layer, a first gate insulating layer, a first gate metal layer, a second gate insulating layer, a second gate metal layer, an interlayer insulating layer, a first source-drain metal layer, a first planar layer, an anode layer, a light-emitting functional layer, a cathode layer, a first inorganic encapsulation layer, an organic encapsulation layer, and a second inorganic encapsulation layer, which are sequentially stacked on the base substrate in a direction away from the base substrate. Exemplarily, the display substrate may also include a passivation layer. The passivation layer may be disposed between the first source-drain metal layer and the first planar layer.

Figure 20:
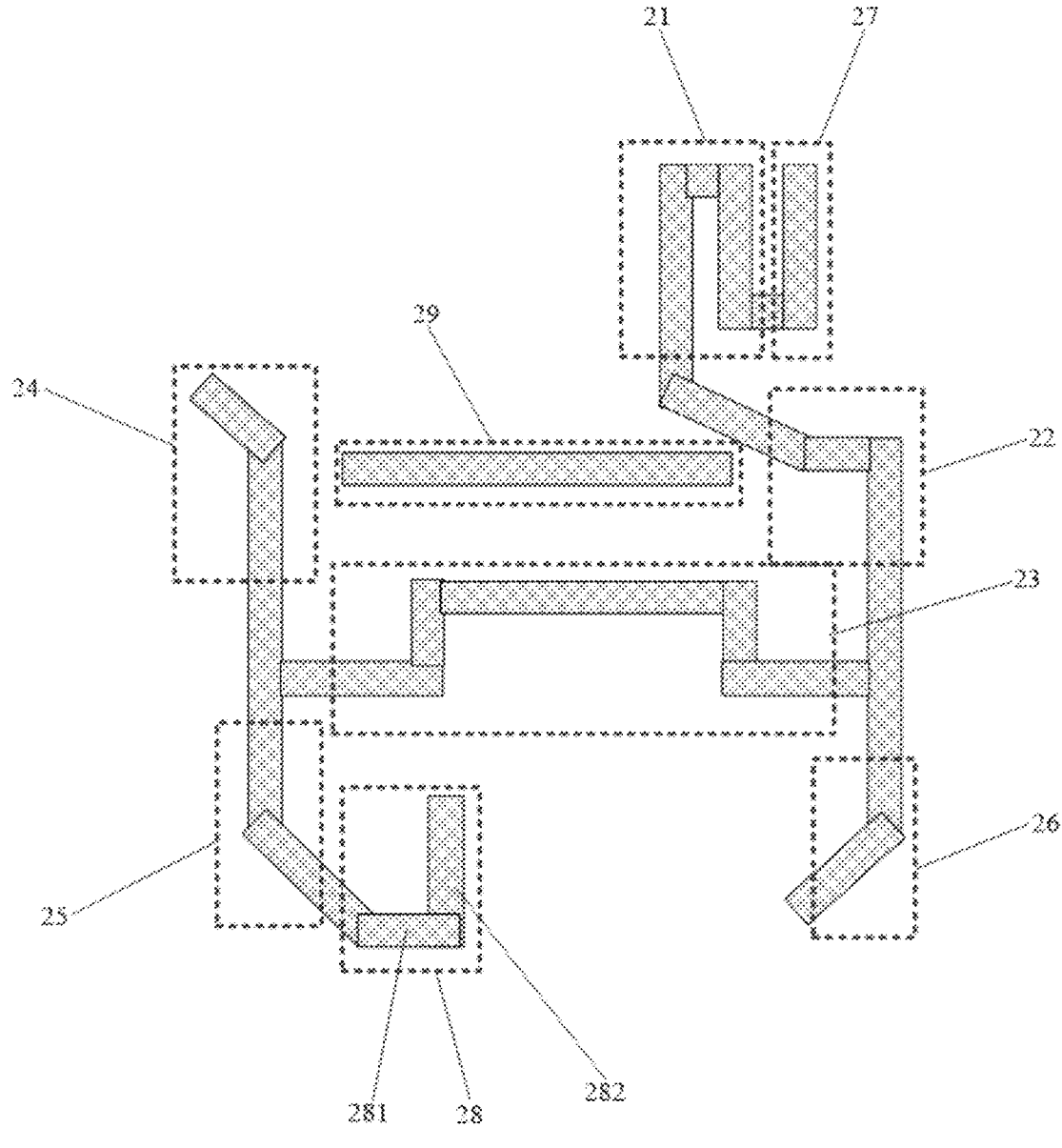
FIG. 20 is a layout diagram of an active layer of a third sub-pixel driver circuit according to an embodiment of the present disclosure.
Figure 21:
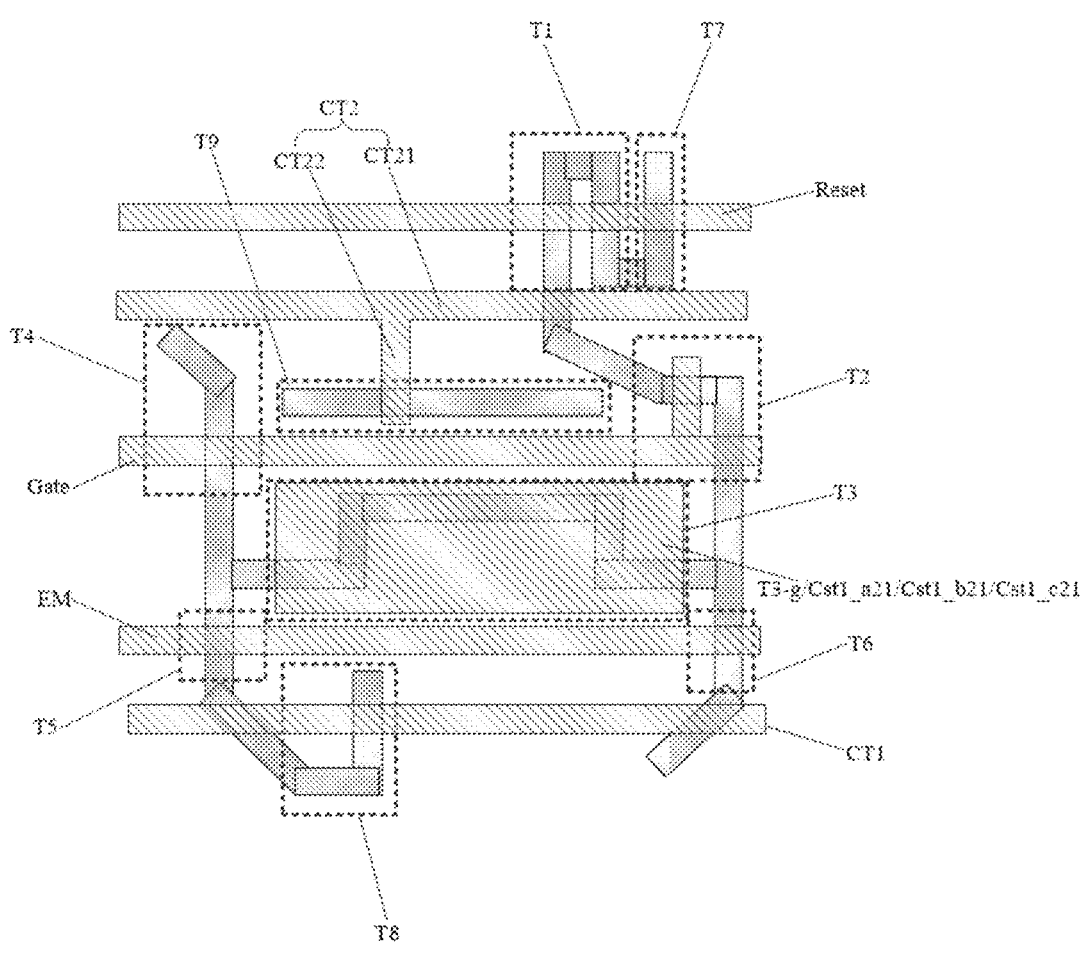
FIG. 21 is a layout diagram of an active layer and a first gate metal layer of a third sub-pixel driver circuit according to an embodiment of the present disclosure.
Figure 22:
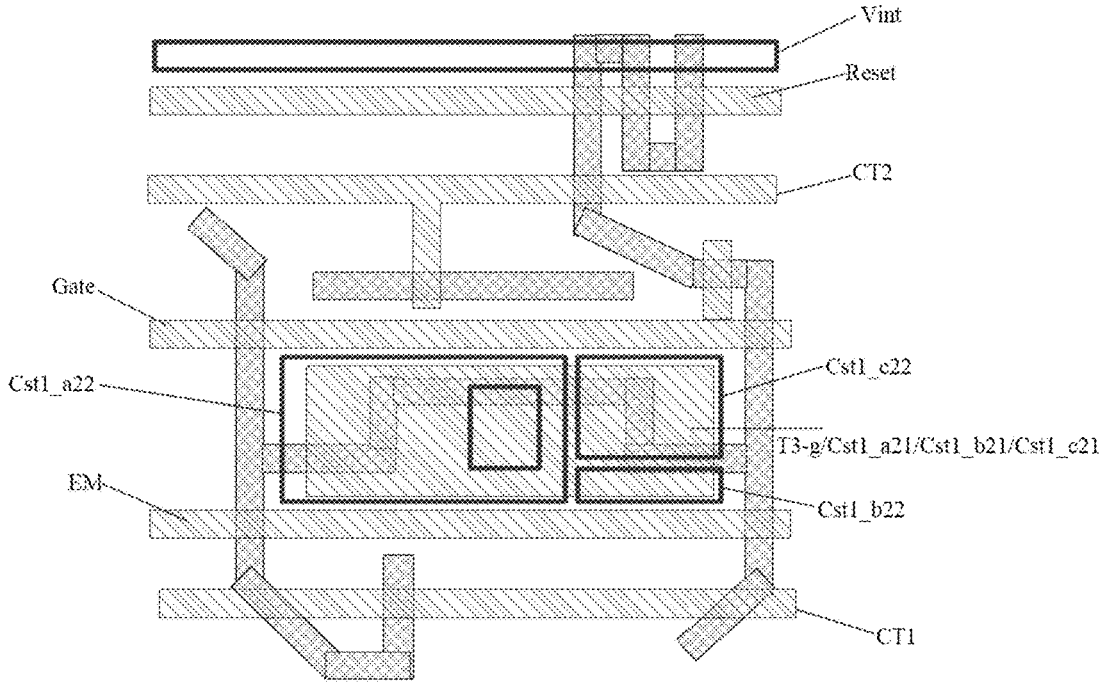
FIG. 22 is a layout diagram showing a second gate metal layer added on the basis of FIG. 21.
Figure 23:
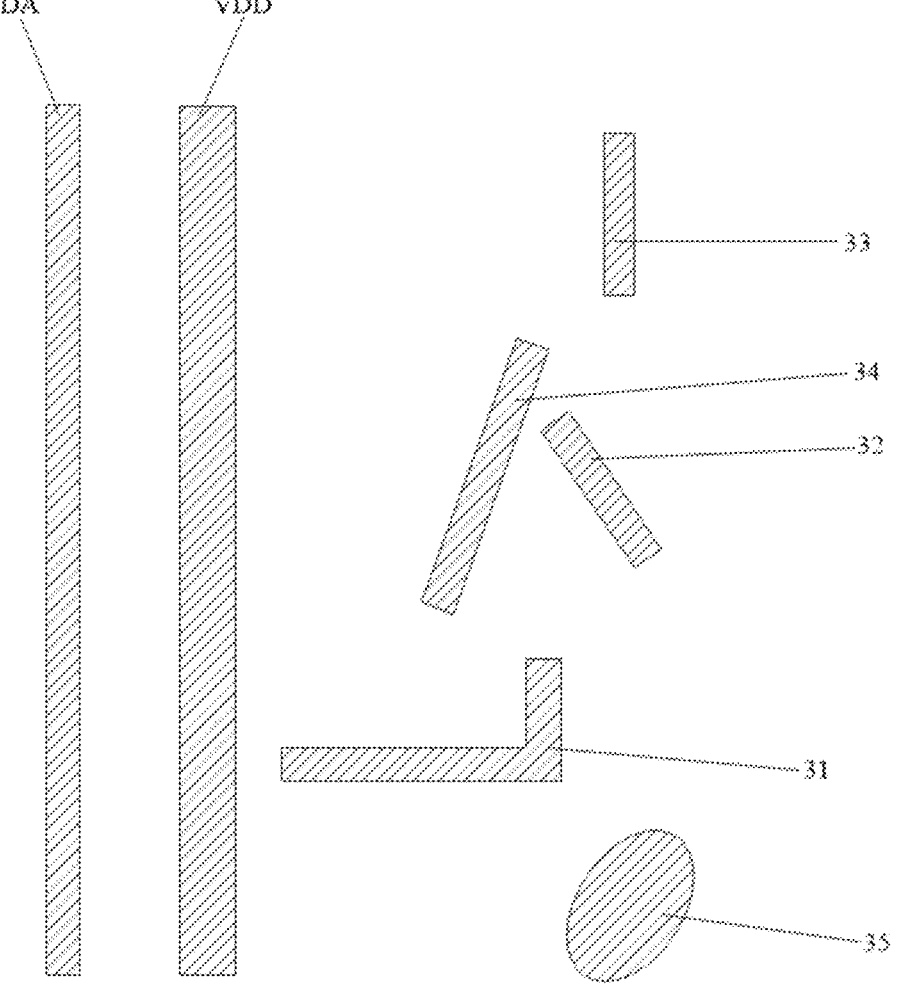
FIG. 23 is a layout diagram of a first source-drain metal layer of a third sub-pixel driver circuit according to an embodiment of the present disclosure.
Figure 24:
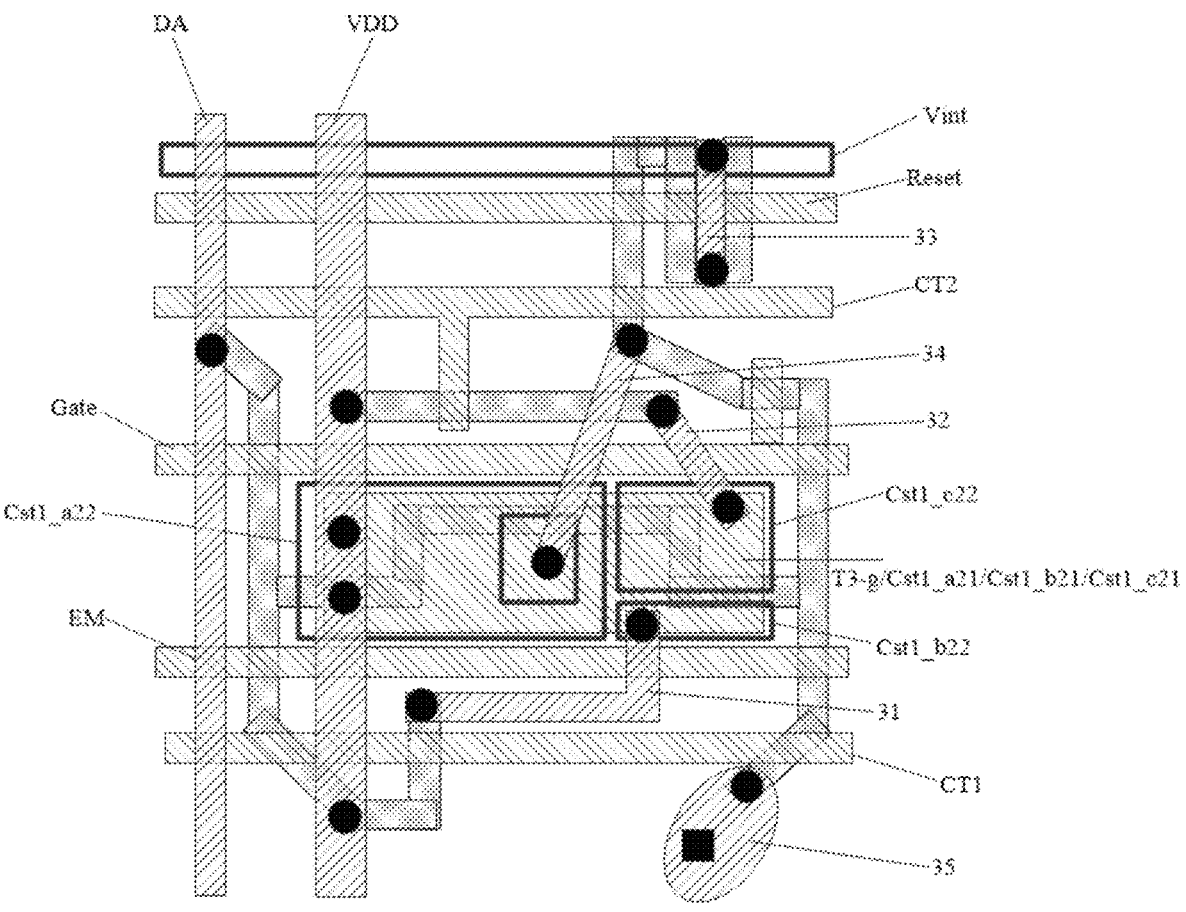
FIG. 24 is a layout diagram showing a first source-drain metal layer added on the basis of FIG. 22.

It is worth noting that, as shown in FIG. 20 which shows a first reset active pattern 21, a compensation active pattern 22, a data writing active pattern 24, a power control active pattern 25, a light-emitting control active pattern 26, and a second reset active pattern 27. FIG. 23 shows a third conductive connection portion 33, a fourth conductive connection portion 34, and a fifth conductive connection portion 35.

Exemplarily, the second electrode plate Cst1_*a*12 of the second capacitor Cst1_*a*1 and the second electrode plate Cst1_*b*12 of the third capacitor Cst1_*b*1 are both made of the second gate metal layer.

Exemplarily, the second electrode plate Cst1_*a*12 of the second capacitor Cst1_*a*1 and the second electrode plate Cst1_*b*12 of the third capacitor Cst1_*b*1 are spaced apart and insulated from each other.

The above configuration reasonably allocates the layout space of the sub-pixel driver circuit, which not only ensures the operation stability and reliability of the sub-pixel driver circuit, but also facilitates the development of narrow frame of the display substrate.

As shown in FIG. 14 to FIG. 19, in some embodiments, the driving transistor T3 includes a driving active pattern 23. An orthographic projection of the second electrode plate Cst1_*b*12 of the third capacitor Cst1_*b*1 onto the substrate at least partially overlaps with an orthographic projection of the driving active pattern 23 onto the substrate.

As shown in FIG. 20 to FIG. 25, in some embodiments, the first electrode plate Cst1_*a*21 of the fourth capacitor Cst1_*a*2, the first electrode plate Cst1_*b*21 of the fifth capacitor Cst1_*b*2 and the first electrode plate Cst1_*c*21 of the sixth capacitor Cst1_*c*2 are formed into an integrated structure.

The second electrode plate Cst1_*a*22 of the fourth capacitor Cst1_*a*2, the second electrode plate Cst1_*b*22 of the fifth capacitor Cst1_*b*2 and the second electrode plate Cst1_*c*22 of the sixth capacitor Cst1_*c*2 are arranged in the same layer. The second electrode plate Cst1_*a*22 of the fourth capacitor Cst1_*a*2 and the second electrode plate Cst1_*b*22 of the fifth capacitor Cst1_*b*2 are arranged along the first direction. The second electrode plate Cst1_*a*22 of the fourth capacitor Cst1_*a*2 and the second electrode plate Cst1_*c*22 of the sixth capacitor Cst1_*c*2 are arranged along the first direction. The second electrode plate Cst1_*b*22 of the fifth capacitor Cst1_*b*2 and the second electrode plate Cst1_*c*22 of the sixth capacitor Cst1_*c*2 are arranged along a second direction. The second direction intersects the first direction.

Exemplarily, the gate T3-*g* of the driving transistor T3 is reused as the first electrode plate Cst1_*a*21 of the fourth capacitor Cst1_*a*2, the first electrode plate Cst1_*b*21 of the fifth capacitor Cst1_*b*2, and the first electrode plate Cst1_*c*21 of the sixth capacitor Cst1_*c*2.

Exemplarily, the second electrode plate Cst1_*a*22 of the fourth capacitor Cst1_*a*2, the second electrode plate Cst1_*b*22 of the fifth capacitor Cst1_*b*2, and the second electrode plate Cst1_*c*22 of the sixth capacitor Cst1_*c*2 are all made of the second gate metal layer.

Exemplarily, the second electrode plate Cst1_*a*22 of the fourth capacitor Cst1_*a*2, the second electrode plate Cst1_*b*22 of the fifth capacitor Cst1_*b*2, and the second electrode plate Cst1_*c*22 of the sixth capacitor Cst1_*c*2 are spaced apart and insulated from each other.

The above configuration reasonably allocates the layout space of the sub-pixel driver circuit, which not only ensures the operation stability and reliability of the sub-pixel driver circuit, but also facilitates the development of narrow frame of the display substrate.

As shown in FIG. 20 to FIG. 25, in some embodiments, the driving transistor T3 includes a driving active pattern 23. An orthographic projection of the second electrode plate Cst1_*b*22 of the fifth capacitor Cst1_*b*2 onto the substrate at least partially overlaps with an orthographic projection of the driving active pattern onto the substrate; and/or an orthographic projection of the second electrode plate Cst1_*c*22 of the sixth capacitor Cst1_*c*2 onto the substrate at least partially overlaps with the orthographic projection of the driving active pattern onto the substrate.

As shown in FIG. 14 to FIG. 25, in some embodiments, the second sub-pixel driver circuit 12 and the third sub-pixel driver circuit 13 further include a first conductive connection portion 31; and the first control transistor T8 includes a first control active pattern 28. The first control active pattern 28 includes a first active portion 281 and a second active portion 282 coupled to each other. The first active portion 281 extends along the first direction, and the second active portion 282 extends along the second direction. The first direction intersects the second direction.

One end of the first active portion 281 away from the second active portion 282 serves as the second electrode of the first control transistor T8; one end of the second active portion 282 away from the first active portion 281 serves as the first electrode of the first control transistor T8; and one end of the second active portion 282 away from the first active portion 281 is coupled to the second electrode plate Cst1_*b*12 of the third capacitor Cst1_*b*1 or the second electrode plate Cst1_*b*22 of the fifth capacitor Cst1_*b*2 through the first conductive connecting portion 31.

Exemplarily, the first conductive connection portion 31 is made of the first source-drain metal layer.

Exemplarily, the first active portion 281 and the second active portion 282 included in the first control active pattern 28 are an integrated structure.

Exemplarily, the first direction is horizontal, and the second direction is vertical, but not limited thereto.

Exemplarily, one end of the first active portion 281 away from the second active portion 282 is coupled to the corresponding power line VDD through a via-hole. One end of the second active portion 282 away from the first active portion 281 is coupled to the first conductive connection portion 31 through a via-hole. The first conductive connection portion 31 is coupled to the second electrode plate Cst1_*b*12 of the third capacitor Cst1_*b*1 or the second electrode plate Cst1_*b*22 of the fifth capacitor Cst1_*b*2 through a via-hole.

As shown in FIG. 14 to 25, in some embodiments, the first conductive connection portion 31 includes a first sub-connection portion 310 and a second sub-connection portion 311 coupled to each other. The first sub-connection portion 310 extends along the first direction, and the second sub-connection portion 311 extends along the second direction.

The first sub-connection portion 310 is coupled to the second active portion 282, and the second sub-connection portion 311 is coupled to the second electrode plate Cst1_*b*12 of the third capacitor Cst1_*b*1 or the second electrode plate Cst1_*b*22 of the fifth capacitor Cst1_*b*2.

Exemplarily, the first sub-connection portion 310 and the second sub-connection portion 311 included in the first conductive connection portion 31 are an integrated structure.

As shown in FIG. 14 to FIG. 25, in some embodiments, the display substrate further includes multiple light-emitting control signal lines EM, and at least a portion of the light-emitting control signal lines EM extends along the first direction.

An orthographic projection of the first sub-connection portion 310 onto the base substrate does not overlap with an orthographic projection of the light-emitting control signal line EM onto the base substrate. An orthographic projection of the second sub-connection portion 311 onto the base substrate at least partially overlaps with the orthographic projection of the light-emitting control signal line EM onto the base substrate.

The above configuration can reduce the influence of the light-emitting control signal transmitted by the light-emitting control signal line EM on the second electrode plate Cst1_*b*12 of the third capacitor Cst1_*b*1 or the second electrode plate Cst1_*b*22 of the fifth capacitor Cst1_*b*2 when the light-emitting control signal jumps.

As shown in FIG. 14 to FIG. 25, in some embodiments, the first control signal line CT1 includes at least a portion extending along the first direction; an orthographic projection of the first sub-connection portion 310 onto the base substrate is located between the orthographic projection of the light-emitting control signal line EM onto the base substrate and an orthographic projection of the first control signal line CT1 onto the base substrate.

Exemplarily, the first control signal line CT1 and the light-emitting control signal line EM are both made of the first gate metal layer.

Exemplarily, the first control signal lines CT1 and the light-emitting control signal lines EM are arranged along the second direction.

The above configuration reasonably allocates the layout space of the sub-pixel driver circuit, which not only ensures the operation stability and reliability of the sub-pixel driver circuit, but also facilitates the development of narrow frame of the display substrate.

Figure 25:
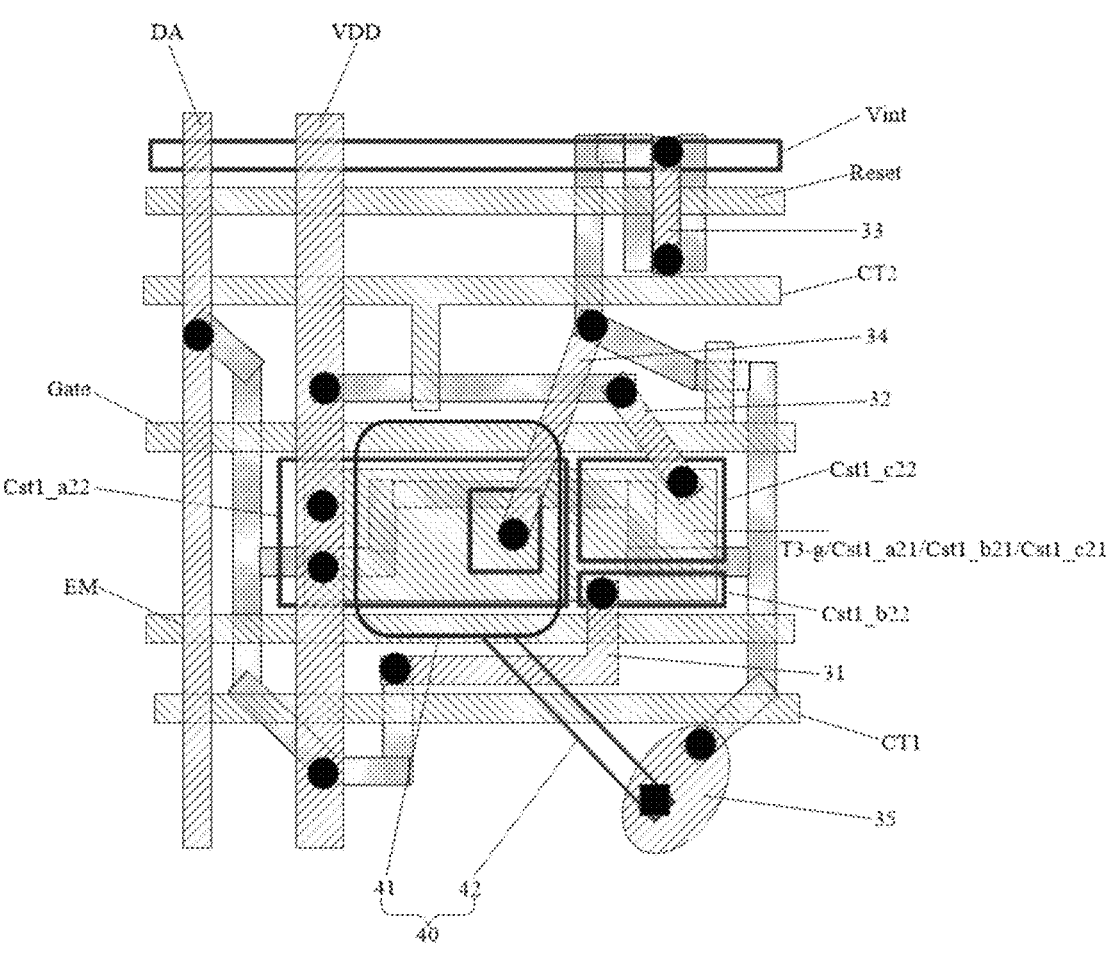
FIG. 25 is a layout diagram showing an anode layer added on the basis of FIG. 24.
Figure 26:
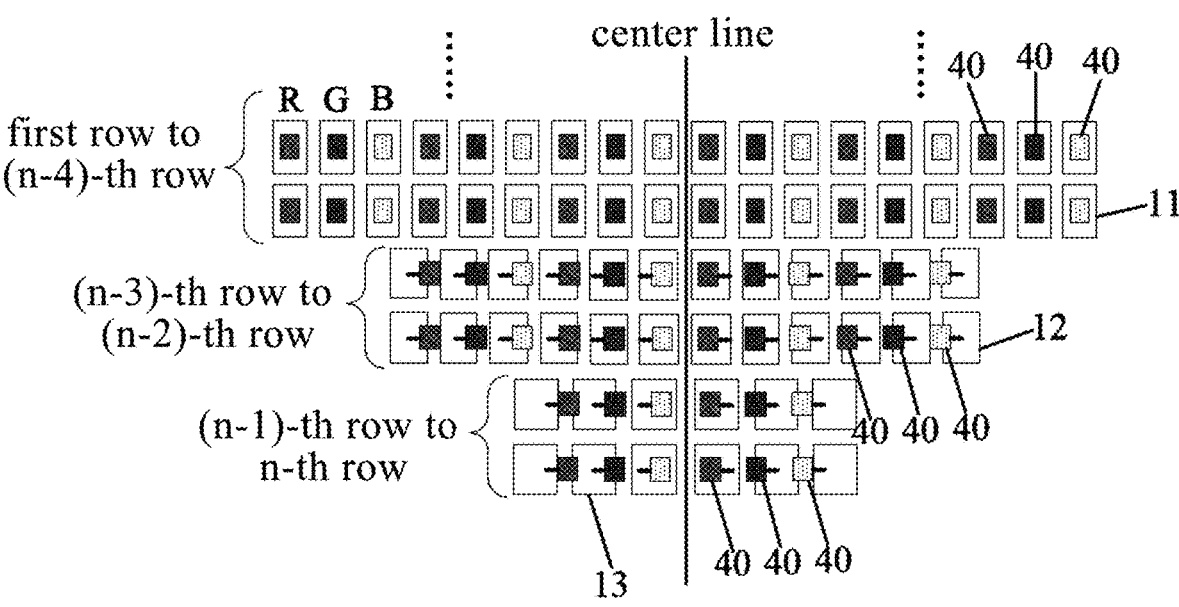
FIG. 26 is a schematic diagram of a pixel layout of a display substrate according to an embodiment of the present disclosure.

As shown in FIG. 25 and FIG. 26, in some embodiments, the sub-pixel in the display substrate also includes a light-emitting element. The light-emitting element includes an anode pattern 40. The orthographic projection of the first sub-connection portion 310 onto the base substrate at least partially overlaps with an orthographic projection of the anode pattern 40 belonging to the same sub-pixel onto the base substrate.

Exemplarily, the anode pattern 40 includes an anode main body 41 and an anode connection portion 42 coupled to each other. The orthographic projection of the first sub-connection portion 310 onto the substrate at least partially overlaps with an orthographic projection of the anode connection portion 42 belonging to the same sub-pixel onto the substrate.

As shown in FIG. 20 to FIG. 26, in some embodiments, the third sub-pixel driver circuit 13 also includes a second conductive connection portion 32; the second control transistor T9 also includes a second control active pattern 29. The second control active pattern 29 includes at least a portion extending along the first direction. A first end of the second control active pattern 29 serves as the first electrode of the second control transistor T9, and the first end of the second control active pattern 29 is coupled to the second electrode plate Cst1_*c*22 of the sixth capacitor Cst1_*c*2 through the second conductive connection portion 32. A second end of the second control active pattern 29 serves as the second electrode of the second control transistor T9.

Exemplarily, the second conductive connection portion 32 is made of the first source-drain metal layer.

Exemplarily, the second conductive connection portion 32 extends along a third direction, and the third direction intersects both the first direction and the second direction.

Exemplarily, the first end of the second control active pattern 29 is coupled to the second conductive connection portion 32 through a via-hole. The second conductive connection portion 32 is coupled to the second electrode plate Cst1_*c*22 of the sixth capacitor Cst1_*c*2 through a via-hole. The second end of the second control active pattern 29 is coupled to the power line VDD through a via-hole.

As shown in FIG. 20 to FIG. 26, in some embodiments, the display substrate further includes multiple gate lines Gate, and the gate line Gate include at least a portion extending along the first direction.

The orthographic projection of the second conductive connection portion 32 onto the base substrate at least partially overlaps with an orthographic projection of the gate line Gate onto the base substrate.

Exemplarily, the orthographic projection of the second conductive connection portion 32 onto the base substrate is located between the orthographic projection of the second control signal line CT2 onto the base substrate and the orthographic projection of the second electrode plate Cst1_*b*22 of the fifth capacitor Cst1_*b*2 onto the base substrate.

As shown in FIG. 20 to FIG. 26, in some embodiments, the second control signal line CT2 includes a control main body portion CT21 and a control protrusion CT22 coupled to each other. The control main body portion CT21 includes at least a portion extending along the first direction. An orthographic projection of the control protrusion CT22 onto the substrate is located between an orthographic projection of the control main body portion CT21 onto the substrate and an orthographic projection of the gate line Gate onto the substrate. The control protrusion CT22 is coupled to the gate of the second control transistor T9.

Exemplarily, the control main body portion CT21 and the control protrusion portion CT22 included in the second control signal line CT2 are an integrated structure.

Exemplarily, the control protrusion CT22 is reused as the gate of the second control transistor T9.

Exemplarily, the second control signal line CT2 is made of the first gate metal layer.

The above configuration reasonably allocates the layout space of the sub-pixel driver circuit, which not only ensures the operation stability and reliability of the sub-pixel driver circuit, but also facilitates the development of narrow frame of the display substrate.

As shown in FIG. 26, in some embodiments, a distance between two adjacent first sub-pixel driver circuits 11 in the same row, a distance between two adjacent second sub-pixel driver circuits 12 in the same row, and a distance between two adjacent third sub-pixel driver circuits 13 in the same row are all the same.

On the same side of a center line extending along the second direction of the display substrate, a first boundary of the first sub-pixel driver circuit 11 closest to the center line, a first boundary of the second sub-pixel driver circuit 12 closest to the center line, and a first boundary of the third sub-pixel driver circuit 13 closest to the center line are aligned.

The first boundary is a boundary toward the center line.

Exemplarily, along the first direction, the first sub-pixel driver circuit 11, the second sub-pixel driver circuit 12 and the third sub-pixel driver circuit 13 are all arranged at the same interval.

Exemplarily, on the left side of the center line extending along the second direction of the display substrate, the first boundary of the first sub-pixel driver circuit 11 closest to the center line, the first boundary of the second sub-pixel driver circuit 12 closest to the center line, and the first boundary of the third sub-pixel driver circuit 13 closest to the center line are aligned.

Exemplarily, on the right side of the center line extending along the second direction of the display substrate, the first boundary of the first sub-pixel driver circuit 11 closest to the center line, the first boundary of the second sub-pixel driver circuit 12 closest to the center line, and the first boundary of the third sub-pixel driver circuit 13 closest to the center line are aligned.

It is worth noting that the first boundary may be a first boundary with respect to the same reference object in the sub-pixel driver circuit, for example, the boundary of the anode main body 41 facing the center line, but not limited thereto.

It is to be noted that the width of the second sub-pixel driver circuit 12 or the third sub-pixel driver circuit 13 in the first direction is greater than the width of the first sub-pixel driver circuit 11. In the present application, on the left and right sides of the center line, the first boundary of the second sub-pixel driver circuit 12 close to the center line in the second region is aligned with the first boundary of the first sub-pixel driver circuit 11 close to the center line in the first region. In the present application, on the left and right sides of the center line, the first boundary of the third sub-pixel driver circuit 13 close to the center line in the third region is aligned with the first boundary of the first sub-pixel driver circuit 11 close to the center line in the first region. The above configuration ensures uniformity of the display substrate and improves the display effect.

As shown in FIG. 26, in some embodiments, the sub-pixel further includes a light-emitting element. The light-emitting element includes an anode pattern 40. The anode pattern 40 includes an anode main body portion 41 and an anode connection portion 42 coupled to each other. The anode connection portion is coupled to a sub-pixel driver circuit included in the sub-pixel to which the anode connection portion belongs.

The anode main portion 41 of the anode pattern 40 coupled to the first sub-pixel driver circuit 11, the anode main portion 41 of the anode pattern 40 coupled to the second sub-pixel driver circuit 12, and the anode main portion 41 of the anode pattern 40 coupled to the third sub-pixel driver circuit 13 are distributed in an array.

Exemplarily, the anode main body 41 and the anode connection portion 42 are formed into an integral structure.

Exemplarily, the anode main portion 41 of the anode pattern 40 coupled to the third sub-pixel driver circuit 13, the anode main portion 41 of the anode pattern 40 coupled to the second sub-pixel driver circuit 12, and the anode main portion 41 of the anode pattern 40 coupled to the first sub-pixel driver circuit 11 can be located in the same column extending along the second direction.

The above arrangement enables the anode patterns 40 included in each sub-pixel to be evenly distributed, which is beneficial to improving the display uniformity of the display substrate.

One embodiment of the present disclosure further provides a display device, including the display substrate provided in the above embodiment.

It is to be noted that the display device may be any product or component with a display function, such as a television, a monitor, a digital photo frame, a mobile phone, a tablet computer, etc. The display device further includes a flexible circuit board, a printed circuit board and a back plate, etc.

In the display substrate provided in the above embodiment, by setting the first sub-pixel driver circuit 11 to include the first capacitor storage unit 110, the second sub-pixel driver circuit 12 to include the second capacitor storage unit 120, and the third sub-pixel driver circuit 13 to include the third capacitor storage unit 130; and the capacitance of the first capacitor storage unit 110 to be smaller than the capacitance of the second capacitor storage unit 120, and the capacitance of the second capacitor storage unit 120 to be smaller than the capacitance of the third capacitor storage unit 130, the difference between $V(1{\sim}i)$, $V(i{+}1/m)$ and $V(m{+}1/n)$ caused by the capacitor storage unit can be reduced, thereby effectively improving the phenomenon that the actual brightness of the sub-pixels in the last few rows of the display substrate is dark, and improving the virtual edge phenomenon of the display substrate.

Therefore, when the display device provided in the embodiment of the present disclosure includes the above display substrate, it also has the above beneficial effects, which will not be described in detail here.

One embodiment of the present disclosure further provides a method for driving a display substrate, which is used to drive the display substrate provided in the above embodiment. The driving method includes:

when charging sub-pixels in the (i+1)-th row to the m-th row, controlling, by the first control signal line, the first control transistor T8 to be turned on;

when charging sub-pixels in the (m+1)-th row to the n-th row, controlling, by the first control signal line, the first control transistor T8 to be turned on, and controlling, by the second control signal line, the second control transistor T9 to be turned on.

When the driving method provided in the embodiment of the present disclosure is used to drive the above display substrate, $V(1{\sim}i){=}Q/(3C1{+}Cdata)$, $V(i{+}1/m){=}Q/(2{*}1.5C1{+}Cdata)$, and $V(m{+}1/n){=}Q/(3C1{+}Cdata)$, thereby minimizing the differences in $V(1{\sim}i)$, $V(i{+}1/m)$ and $V(m{+}1/n)$ caused by the capacitor storage unit, which enables each row of sub-pixels in the full screen of the display substrate to have consistent loading at the charging time, thereby effectively improving the phenomenon that the actual brightness of the sub-pixels in the last few rows of the display substrate is dark, and improving the virtual edge phenomenon of the display substrate.

It is to be noted that the signal line extending along an X direction means that the signal line includes a main part and a secondary part connected to the main part, the main part is a line, a line segment or a strip-shaped body, the main part extends along the X direction, and a length of the main part extending along the X direction is greater than a length of the secondary part extending along other directions.

It is to be noted that the "same layer" in the embodiment of the present disclosure may refer to a film layer on the same structural layer. Or, for example, film layers in the same layer may be formed by using the same film forming process to form a film layer for forming a specific pattern, and then using the same mask template to pattern the film layer through a patterning process to form a layer structure. Depending on the specific pattern, one single patterning process may include multiple exposure, development or etching processes and specific patterns in the formed layer structure may be continuous or discontinuous. These specific patterns may also be at different heights or have different thicknesses.

In the various method embodiments of the present disclosure, the serial numbers of the steps cannot be used to limit the sequence of the steps. For those of ordinary skill in the art, without any creative effort, changes in the sequence of steps are also within the scope of the present disclosure.

It is to be noted that each embodiment in the specification is described in a progressive manner, and the same or similar parts between the embodiments can be referred to each other, and each embodiment focuses on the differences from other embodiments. In particular, for the method embodiment, since it is basically similar to the product embodiment, the description is relatively simple, and the relevant parts can be referred to the description of the product embodiment.

Unless otherwise defined, the technical terms or scientific terms used in the present disclosure should be understood by those of ordinary skill in the art to which the present disclosure belongs. The "first", "second" and similar words used in the present disclosure do not indicate any order, quantity or importance, but are only used to distinguish different components. "Including" or "having" and similar words mean that an element or object appearing before the word covers elements or objects listed after the word and their equivalents, without excluding other elements or objects. "Connecting", "coupling" or "connected" and similar words are not limited to physical or mechanical connections, but may include electrical connections, whether direct or indirect. "Up", "down", "left", "right" and the like are only used to indicate relative positional relationships. When an absolute position of a described object changes, the relative positional relationship may also change accordingly.

It is to be understood that when an element such as a layer, film, region, or substrate is referred to as being "on" or "under" another element, the element can be "directly on" or "under" the other element or an intervening element may be present.

In the description of the above embodiments, specific features, structures, materials or characteristics may be combined in a suitable manner in any one or more embodiments or examples.

The above is only a specific embodiment of the present disclosure, but the protection scope of the present disclosure is not limited thereto. Any person skilled in the art who is familiar with the technical field can easily think of changes or substitutions within the technical scope disclosed in the present disclosure, which should be included in the protection scope of the present disclosure. Therefore, the protection scope of the present disclosure should be based on the protection scope of the claims.

What is claimed is:

1. A display substrate, comprising a base substrate and n rows of sub-pixels on the base substrate, wherein;

each sub-pixel in a first row of sub-pixels to an i-th row of sub-pixels includes a first sub-pixel driver circuit, each sub-pixel in a (i+1)-th row of sub-pixels to an m-th row of sub-pixels includes a second sub-pixel driver circuit, each sub-pixel in a (m+1)-th row of sub-pixels to an n-th row of sub-pixels includes a third sub-pixel driver circuit, $1 < i < m$, $m < n$;

each first sub-pixel driver circuit includes a first capacitor storage unit, each second sub-pixel driver circuit includes a second capacitor storage unit, and each third sub-pixel driver circuit includes a third capacitor storage unit;

a capacitance of the first capacitor storage unit is smaller than a capacitance of the second capacitor storage unit; the capacitance of the second capacitor storage unit is smaller than a capacitance of the third capacitor storage unit; and $C3 = 3C1$, $C2 = 1.5C1$, $C3$ is the capacitance of the third capacitor storage unit, $C2$ is the capacitance of the second capacitor storage unit, and $C1$ is the capacitance of the first capacitor storage unit.

2. The display substrate according to claim 1, wherein the display substrate further includes a plurality of power supply lines; and each first sub-pixel driver circuit further includes a driving transistor;

the first capacitor storage unit includes a first capacitor; a first electrode plate of the first capacitor is coupled to a gate of the driving transistor, and a second electrode plate of the first capacitor is coupled to a corresponding power line.

3. The display substrate according to claim 2, wherein the display substrate further includes a plurality of first control signal lines; each second sub-pixel driver circuit further includes a driving transistor and a first control transistor; the second capacitor storage unit includes a second capacitor and a third capacitor;

a first electrode plate of the second capacitor is coupled to a gate of the driving transistor, and a second electrode plate of the second capacitor is coupled to a corresponding power line; a first electrode plate of the third capacitor is coupled to the gate of the driving transistor, a second electrode plate of the third capacitor is coupled to a first electrode of the first control transistor; a second electrode of the first control transistor is coupled to a corresponding power line, and a gate of the first control transistor is coupled to the corresponding first control signal line.

4. The display substrate according to claim 3, wherein the display substrate further includes at least two second control signal lines; each third sub-pixel driver circuit further includes a driving transistor, a first control transistor and a second control transistor; the third capacitor storage unit includes a fourth capacitor, a fifth capacitor and a sixth capacitor;

a first electrode plate of the fourth capacitor is coupled to a gate of the driving transistor, and a second electrode plate of the fourth capacitor is coupled to a corresponding power line;

a first electrode plate of the fifth capacitor is coupled to the gate of the driving transistor, a second electrode plate of the fifth capacitor is coupled to a first electrode of the first control transistor; a second electrode of the first control transistor is coupled to a corresponding power line; and a gate of the first control transistor is coupled to the corresponding first control signal line;

a first electrode plate of the sixth capacitor is coupled to the gate of the driving transistor, a second electrode plate of the sixth capacitor is coupled to a first electrode of the second control transistor, a second electrode of the second control transistor is coupled to a corresponding power line, and a gate of the second control transistor is coupled to the corresponding second control signal line.

5. The display substrate according to claim 4, wherein the capacitance value of the fourth capacitor is equal to the capacitance value of the first capacitor, the capacitance value of the fifth capacitor is half of the capacitance value of the first capacitor, and the capacitance value of the sixth capacitor is 1.5 times the capacitance value of the first capacitor;

or, wherein the first electrode plate of the fourth capacitor, the first electrode plate of the fifth capacitor and the first electrode plate of the sixth capacitor are an integrated structure;

the second electrode plate of the fourth capacitor, the second electrode plate of the fifth capacitor and the second electrode plate of the sixth capacitor are in the same layer; the second electrode plate of the fourth capacitor and the second electrode plate of the fifth capacitor are arranged along the first direction; the second electrode plate of the fourth capacitor and the second electrode plate of the sixth capacitor are arranged along the first direction; the second electrode plate of the fifth capacitor and the second electrode plate of the sixth capacitor are arranged along a second direction, and the second direction intersects the first direction;

or, wherein the driving transistor includes a driving active pattern; an orthographic projection of the second electrode plate of the fifth capacitor onto the base substrate at least partially overlaps with an orthographic projection of the driving active pattern onto the base substrate; and/or an orthographic projection of the second electrode plate of the sixth capacitor onto the base substrate at least partially overlaps with the orthographic projection of the driving active pattern onto the base substrate.

6. The display substrate according to claim 3, wherein a capacitance value of the second capacitor is equal to a capacitance value of the first capacitor, and a capacitance value of the third capacitor is half of the capacitance value of the first capacitor or, wherein the first electrode plate of the second capacitor and the first electrode plate of the third capacitor are an integrated structure; the second electrode plate of the second capacitor and the second electrode plate of the third capacitor are in the same layer, and the second electrode plate of the second capacitor and the second electrode plate of the third capacitor are arranged along a first direction;

or, wherein the driving transistor includes a driving active pattern; and an orthographic projection of the second electrode plate of the third capacitor onto the base substrate at least partially overlaps with an orthographic projection of the driving active pattern onto the base substrate.

7. The display substrate according to claim 3, wherein each second sub-pixel driver circuit and each third sub-pixel driver circuit further include a first conductive connection portion; the first control transistor includes a first control active pattern, the first control active pattern includes a first active portion and a second active portion coupled to each other, the first active portion extends along a first direction, the second active portion extends along a second direction, and the first direction intersects the second direction;

one end of the first active portion away from the second active portion serves as the second electrode of the first control transistor, one end of the second active portion away from the first active portion serves as the first electrode of the first control transistor, and one end of the second active portion away from the first active portion is coupled to the second electrode plate of the third capacitor or the second electrode plate of the fifth capacitor through the first conductive connection portion.

8. The display substrate according to claim 7, wherein the first conductive connection portion includes a first sub-connection portion and a second sub-connection portion coupled to each other, the first sub-connection portion extends along the first direction, and the second sub-connection portion extends along the second direction;

the first sub-connection portion is coupled to the second active portion, and the second sub-connection portion is coupled to the second electrode plate of the third capacitor or the second electrode plate of the fifth capacitor.

9. The display substrate according to claim 8, wherein the display substrate further includes a plurality of light-emitting control signal lines, at least part of the light-emitting control signal lines extending along the first direction;

an orthographic projection of the first sub-connection portion onto the base substrate does not overlap with an orthographic projection of the light-emitting control signal line onto the base substrate, and an orthographic projection of the second sub-connection portion onto the base substrate at least partially overlaps with the orthographic projection of the light-emitting control signal line onto the base substrate.

10. The display substrate according to claim 8, wherein the first control signal line includes at least a portion extending along the first direction;

the orthographic projection of the first sub-connection portion onto the base substrate is located between the orthographic projection of the light-emitting control signal line onto the base substrate and the orthographic projection of the first control signal line onto the base substrate.

11. The display substrate according to claim 10, wherein each third sub-pixel driver circuit further includes a second conductive connection portion; the second control transistor further includes a second control active pattern, the second control active pattern includes at least a portion extending along the first direction, a first end of the second control active pattern serves as the first electrode of the second control transistor, the first end of the second control active pattern is coupled to the second electrode plate of the sixth capacitor through the second conductive connection portion, and a second end of the second control active pattern serves as the second electrode of the second control transistor.

12. The display substrate according to claim 11, wherein the display substrate further includes a plurality of gate lines, the gate line includes at least a portion extending along the first direction;

an orthographic projection of the second conductive connection portion onto the base substrate at least partially overlaps with an orthographic projection of the gate lines onto the base substrate.

13. The display substrate according to claim 11, wherein the second control signal line includes a control main body portion and a control protrusion portion coupled to each other, the control main body portion includes at least a portion extending along the first direction, an orthographic projection of the control protrusion portion onto the base substrate is located between an orthographic projection of the control main body portion onto the base substrate and an orthographic projection of the gate line onto the base substrate, and the control protrusion is coupled to the gate of the second control transistor.

14. The display substrate according to claim 8, wherein the sub-pixel in the display substrate further includes a light-emitting element, and the light-emitting element includes an anode pattern; the orthographic projection of the first sub-connection portion onto the base substrate at least partially overlaps with an orthographic projection of the anode pattern in the same sub-pixel onto the base substrate.

15. The display substrate according to claim 1, wherein a distance between two adjacent first sub-pixel driver circuits in the same row, a distance between two adjacent second sub-pixel driver circuits in the same row, and a distance between two adjacent third sub-pixel driver circuits in the same row are all the same;

on a same side of a center line extending along a second direction of the display substrate, a first boundary of the first sub-pixel driver circuit closest to the center line, a first boundary of the second sub-pixel driver circuit closest to the center line, and a first boundary of the third sub-pixel driver circuit closest to the center line are aligned;

the first boundary of the first sub-pixel driver circuit, the first boundary of the second sub-pixel driver circuit, and the first boundary of the third sub-pixel driver circuit are all boundaries toward the center line.

16. The display substrate according to claim 15, wherein the sub-pixel further includes a light-emitting element, the light-emitting element includes an anode pattern, the anode pattern includes an anode main body portion and an anode connection portion coupled to each other, and the anode connection portion is coupled to the sub-pixel driver circuit included in the sub-pixel to which the anode connection portion belongs;

the anode main portion of the anode pattern coupled to the first sub-pixel driver circuit, the anode main portion of the anode pattern coupled to the second sub-pixel driver circuit, and the anode main portion of the anode pattern coupled to the third sub-pixel driver circuit are distributed in an array.

17. The display substrate according to claim 15, wherein i=n−4 and m=n−2.

18. A method for driving the display substrate according to claim 1, wherein:

the display substrate further comprises a plurality of first control signal lines;

each second sub-pixel driver circuit further comprises a driving transistor and a first control transistor:

the second capacitor storage unit comprises a third capacitor;

a first electrode plate of the third capacitor is coupled to the gate of the driving transistor, a second electrode plate of the third capacitor is coupled to a first electrode of the first control transistor; a second electrode of the first control transistor is coupled to a corresponding power line, and a gate of the first control transistor is coupled to the corresponding first control signal line;

the display substrate further comprises at least two second control signal lines; each third sub-pixel driver circuit further comprises a driving transistor, a first control transistor and a second control transistor; the third capacitor storage unit comprises a fifth capacitor and a sixth capacitor;

a first electrode plate of the fifth capacitor is coupled to the gate of the driving transistor, a second electrode plate of the fifth capacitor is coupled to a first electrode of the first control transistor;

a second electrode of the first control transistor is coupled to a corresponding power line; and a gate of the first control transistor is coupled to the corresponding first control signal line;

a first electrode plate of the sixth capacitor is coupled to the gate of the driving transistor, a second electrode plate of the sixth capacitor is coupled to a first electrode of the second control transistor, a second electrode of the second control transistor is coupled to a corresponding power line, and a gate of the second control transistor is coupled to the corresponding second control signal line; and the method comprises:

when charging sub-pixels in a (i+1)-th row to an m-th row, controlling, by the first control signal line, the first control transistor to be turned on; and when charging sub-pixels in a (m+1)-th row to an n-th row, controlling, by the first control signal line, the first control transistor to be turned on, and controlling, by the second control signal line, the second control transistor to be turned on.

19. A display device, comprises a display substrate, wherein:

the display substrate includes a base substrate and n rows of sub-pixels on the base substrate;

each sub-pixel in a first row of sub-pixels to an i-th row of sub-pixels includes a first sub-pixel driver circuit, each sub-pixel in a (i+1)-th row of sub-pixels to an m-th row of sub-pixels includes a second sub-pixel driver circuit, each sub-pixel in a (m+1)-th row of sub-pixels to an n-th row of sub-pixels includes a third sub-pixel driver circuit, $1<i<m$, $m<n$;

each first sub-pixel driver circuit includes a first capacitor storage unit, each second sub-pixel driver circuit includes a second capacitor storage unit, and each third sub-pixel driver circuit includes a third capacitor storage unit;

a capacitance of the first capacitor storage unit is smaller than a capacitance of the second capacitor storage unit; the capacitance of the second capacitor storage unit is smaller than a capacitance of the third capacitor storage unit; and C3=3C1, C2=1.5C1, C3 is the capacitance of the third capacitor storage unit, C2 is the capacitance of the second capacitor storage unit, and C1 is the capacitance of the first capacitor storage unit.

20. A display substrate comprising a base substrate and n rows of sub-pixels on the base substrate, wherein:

each sub-pixel in a first row of sub-pixels to an i-th row of sub-pixels includes a first sub-pixel driver circuit, each sub-pixel in a (i+1)-th row of sub-pixels to an m-th row of sub-pixels includes a second sub-pixel driver circuit, each sub-pixel in a (m+1)-th row of sub-pixels to an n-th row of sub-pixels includes a third sub-pixel driver circuit, 1<i<m, m<n;

each first sub-pixel driver circuit includes a first capacitor storage unit, each second sub-pixel driver circuit includes a second capacitor storage unit, and each third sub-pixel driver circuit includes a third capacitor storage unit;

a capacitance of the first capacitor storage unit is smaller than a capacitance of the second capacitor storage unit; the capacitance of the second capacitor storage unit is smaller than a capacitance of the third capacitor storage unit;

the display substrate further includes a plurality of power supply lines;

each first sub-pixel driver circuit further includes a driving transistor;

the first capacitor storage unit includes a first capacitor;

a first electrode plate of the first capacitor is coupled to a gate of the driving transistor, and a second electrode plate of the first capacitor is coupled to a corresponding power line;

the display substrate further includes a plurality of first control signal lines;

each second sub-pixel driver circuit further includes a driving transistor and a first control transistor; the second capacitor storage unit includes a second capacitor and a third capacitor;

a first electrode plate of the second capacitor is coupled to a gate of the driving transistor, and a second electrode plate of the second capacitor is coupled to a corresponding power line;

26 a first electrode plate of the third capacitor is coupled to the gate of the driving transistor, a second electrode plate of the third capacitor is coupled to a first electrode of the first control transistor;

a second electrode of the first control transistor is coupled to a corresponding power line, and a gate of the first control transistor is coupled to the corresponding first control signal line;

each second sub-pixel driver circuit and each third sub-pixel driver circuit further include a first conductive connection portion;

the first control transistor includes a first control active pattern, the first control active pattern includes a first active portion and a second active portion coupled to each other, the first active portion extends along a first direction, the second active portion extends along a second direction, and the first direction intersects the second direction; and one end of the first active portion away from the second active portion serves as the second electrode of the first control transistor, one end of the second active portion away from the first active portion serves as the first electrode of the first control transistor, and one end of the second active portion away from the first active portion is coupled to the second electrode plate of the third capacitor or the second electrode plate of the fifth capacitor through the first conductive connection portion.

* * * * *